United States Patent
Ke et al.

(10) Patent No.: US 9,520,418 B2
(45) Date of Patent: Dec. 13, 2016

(54) ACTIVE ARRAY SUBSTRATE AND MANUFACTURING METHOD THEREOF

(71) Applicant: AU Optronics Corporation, Hsin-Chu (TW)

(72) Inventors: Tsung-Ying Ke, Hsin-Chu (TW); Pin-Fan Wang, Hsin-Chu (TW); Tsi-Hsuan Hsu, Hsin-Chu (TW); Wei-Te Lee, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 14/844,792

(22) Filed: Sep. 3, 2015

(65) Prior Publication Data
US 2015/0380444 A1 Dec. 31, 2015

Related U.S. Application Data

(62) Division of application No. 14/196,215, filed on Mar. 4, 2014, now Pat. No. 9,159,744.

(30) Foreign Application Priority Data

May 24, 2013 (CN) .......................... 2013 1 0198732

(51) Int. Cl.
*H01L 27/12* (2006.01)
*G03F 7/20* (2006.01)
*G03F 7/30* (2006.01)

(52) U.S. Cl.
CPC ............ *H01L 27/1266* (2013.01); *G03F 7/20* (2013.01); *G03F 7/30* (2013.01); *H01L 27/1218* (2013.01); *H01L 27/1222* (2013.01); *H01L 27/1262* (2013.01)

(58) Field of Classification Search
CPC ............ H01L 27/1266; H01L 27/1222; H01L 27/1218; H01L 27/1262; G03F 7/30; G03F 7/20
USPC .......................................................... 257/59
See application file for complete search history.

(56) References Cited

U.S. PATENT DOCUMENTS

| 6,798,442 | B1 | 9/2004 | Kim et al. |
| 6,818,923 | B2 | 11/2004 | Kim et al. |
| 7,436,461 | B2 | 10/2008 | Choi et al. |
| 7,736,964 | B2 | 6/2010 | Yamamoto et al. |
| 8,546,210 | B2 | 10/2013 | Yamamoto et al. |
| 8,575,740 | B2 | 11/2013 | Arai et al. |
| 2008/0230775 | A1* | 9/2008 | Rhee ................... H01L 27/3244 257/40 |
| 2010/0045919 | A1 | 2/2010 | Chida et al. |
| 2011/0207328 | A1* | 8/2011 | Speakman .......... H01L 51/0016 438/694 |

(Continued)

FOREIGN PATENT DOCUMENTS

| CN | 1822351 | 8/2006 |
| CN | 101271905 | 9/2008 |

(Continued)

*Primary Examiner* — Adam S Bowen
(74) *Attorney, Agent, or Firm* — WPAT, PC; Justin King

(57) ABSTRACT

An active array substrate includes a flexible substrate, an inorganic barrier layer, and at least one active component. The inorganic barrier layer covers the flexible substrate. The inorganic barrier layer has a through hole therein. The through hole of the inorganic barrier layer exposes the flexible substrate. The active component is disposed on the inorganic barrier layer.

6 Claims, 20 Drawing Sheets

(56) References Cited

U.S. PATENT DOCUMENTS

| | | | | |
|---|---|---|---|---|
| 2012/0052214 A1* | 3/2012 | Tsai | ....................... | G03F 7/2016 |
| | | | | 427/558 |
| 2013/0071650 A1* | 3/2013 | Liu | ....................... | B32B 37/26 |
| | | | | 428/333 |
| 2013/0075739 A1* | 3/2013 | Loy | ..................... | H01L 21/6835 |
| | | | | 257/60 |
| 2013/0105089 A1* | 5/2013 | Chen | ....................... | B32B 38/10 |
| | | | | 156/701 |
| 2014/0342148 A1* | 11/2014 | Bookbinder | ...... | B32B 17/10036 |
| | | | | 428/336 |

FOREIGN PATENT DOCUMENTS

| | | |
|---|---|---|
| CN | 102522420 | 6/2012 |
| CN | 102931136 A | 2/2013 |
| EP | 2452814 A1 | 5/2012 |
| KR | 20080045502 A | 5/2008 |

\* cited by examiner

ACTIVE ARRAY SUBSTRATE AND MANUFACTURING METHOD THEREOF

RELATED APPLICATIONS

This Application is a Divisional of U.S. application Ser. No. 14/196,215, filed on Mar. 4, 2014, which claims the benefit of Chinese Application No. 201310198732.1, filed on May 24, 2013, the entirety of which are incorporated by reference herein.

BACKGROUND

Technical Field

The present disclosure relates to an active array substrate and the manufacturing method thereof.

Description of Related Art

Recently, a display device with a substrate made of a flexible material is developed in the industry. Because this display device possesses certain flexibility, the traditional paper or advertisement board may be replaced with this display device. However, since the substrate is flexible, the substrate is fixed on a carrier first to be adapted to the conventional manufacturing equipments so that the manufacturing process can be performed easily. After the manufacturing process is accomplished, the substrate is stripped from the carrier.

Generally, there is two ways to strip the substrate from the carrier. One is laser stripping, and the other is photooxidation. The cost of laser stripping is high and hard to be reduced. In the technology of photooxidation, a photosensitive stripping layer is disposed between the substrate and the carrier. After the manufacturing process is accomplished, the photosensitive stripping layer is exposed to ultraviolet light and is oxidated so that the adhesion between the substrate and the carrier is reduced. However, because the substrate is usually covered by an inorganic barrier layer which prevents the photosensitive stripping layer from being in contact with oxygen, the photosensitive stripping layer may be in contact with oxygen merely at the exposed side portions. Accordingly, the photooxidation of the photosensitive stripping layer is significantly slow, and thus it is not practical for now.

SUMMARY

According to one embodiment of this invention, an active array substrate includes a flexible substrate, an inorganic barrier layer, and at least one active component. The inorganic barrier layer covers the flexible substrate. The inorganic barrier layer has a through hole therein. The through hole of the inorganic barrier layer exposes the flexible substrate. The active component is disposed on the inorganic barrier layer.

In one or more embodiments of this invention, the active component may include a gate electrode, a gate dielectric layer, a channel layer, a source, and a drain. The gate electrode is disposed on the inorganic barrier layer. The gate dielectric layer at least covers the gate electrode. The channel layer is disposed on at least a portion of the gate dielectric layer that is on the gate electrode. The source and the drain are located on opposite sides of the channel layer respectively.

In one or more embodiments of this invention, the gate dielectric layer covers the gate electrode and the inorganic barrier layer. The gate dielectric layer has at least one through hole therein. The hole of the gate dielectric layer is connected to the through hole of the inorganic barrier layer.

In one or more embodiments of this invention, there is a space between the through hole of the inorganic barrier layer and the gate electrode.

In one or more embodiments of this invention, the active array substrate further includes an inorganic protection layer, an organic protection layer, and a pixel electrode. The inorganic protection layer covers the active component. The inorganic protection layer has at least one through hole therein. The through hole of the inorganic protection layer overlaps with the through hole of the gate dielectric layer and the through hole of the inorganic barrier layer. The organic protection layer covers the inorganic protection layer. The pixel electrode is disposed on the organic protection layer and is electrically connected to the active component.

In one or more embodiments of this invention, the active array substrate further includes an inorganic protection layer. The inorganic protection layer covers the active component and has at least one through hole therein. The through hole of the inorganic protection layer overlaps with the through hole of the inorganic barrier layer.

In one or more embodiments of this invention, the active array substrate further includes an organic protection layer. The organic protection layer covers the active component.

In one or more embodiments of this invention, the organic protection layer has at least one through hole therein. The through hole of the organic protection layer overlaps with the through hole of the inorganic barrier layer.

In one or more embodiments of this invention, at least portion of the organic protection layer is filled in the through hole of the inorganic barrier layer.

In one or more embodiments of this invention, the active array substrate further includes a pixel electrode. The pixel electrode is disposed on the active component and is electrically connected to the active component.

In one or more embodiments of this invention, the pixel electrode may have at least one through hole therein. The pixel electrode through hole overlaps with the through hole of the inorganic barrier layer.

In one or more embodiments of this invention, the pixel electrode may cover the through hole of the inorganic barrier layer.

In one or more embodiments of this invention, the active array substrate further includes at least one inorganic filling material, and the inorganic filling material conformally covers the through hole of the inorganic barrier layer.

In one or more embodiments of this invention, the active array substrate further includes a photosensitive stripping layer. The photosensitive stripping layer is disposed on the surface of the flexible substrate opposite to the inorganic barrier layer.

According to another embodiment of this invention, the manufacturing method of an active array substrate includes the steps of (It should be understood that unless otherwise indicated, the sequence may be arranged as required. Even all or partial of the steps may be performed simultaneously.):

(1) forming a flexible substrate on a carrier with a photosensitive stripping layer therebetween;
(2) forming an inorganic barrier layer to cover the flexible substrate;
(3) forming at least one active component on the inorganic barrier layer;
(4) forming a through hole in the inorganic barrier layer to expose the flexible substrate;

(5) irradiating the photosensitive stripping layer with a light source; and (6) stripping the photosensitive stripping layer from the carrier.

In one or more embodiments of this invention, the step (3) further includes the steps of:

(3.1) forming a gate electrode on the inorganic barrier layer;

(3.2) forming a gate dielectric layer at least covering the gate electrode;

(3.3) forming a channel layer on at least a portion of the gate dielectric layer that is on the gate electrode; and (3.4) forming a source and a drain on opposite sides of the channel layer.

In one or more embodiments of this invention, the manufacturing method of an active array substrate further includes: forming a through hole in the gate dielectric layer. The through hole of the gate dielectric layer is connected to the through hole of the inorganic barrier layer to form a gas hole which exposes the flexible substrate.

In one or more embodiments of this invention, the manufacturing method of an active array substrate further includes: forming a through hole in the gate dielectric layer; and forming an inorganic protection layer to cover the active component. The inorganic protection layer has at least one through hole therein. The through hole of the inorganic protection layer is connected to the through hole of the gate dielectric layer and the through hole of inorganic barrier layer to form a gas hole. An organic protection layer is formed on the inorganic protection layer. A pixel electrode is formed on the organic protection layer and is electrically connected to the active component.

In one or more embodiments of this invention, the manufacturing method of an active array substrate further includes: forming an inorganic protection layer to cover the active component. The inorganic protection layer has at least one through hole therein. The through hole of the inorganic protection layer is connected to the through hole of inorganic barrier layer to form a gas hole which exposes the flexible substrate.

In one or more embodiments of this invention, the manufacturing method of an active array substrate further includes: forming an inorganic filling material in the through hole of the inorganic barrier layer.

DESCRIPTION OF THE EMBODIMENTS

Figure 1:
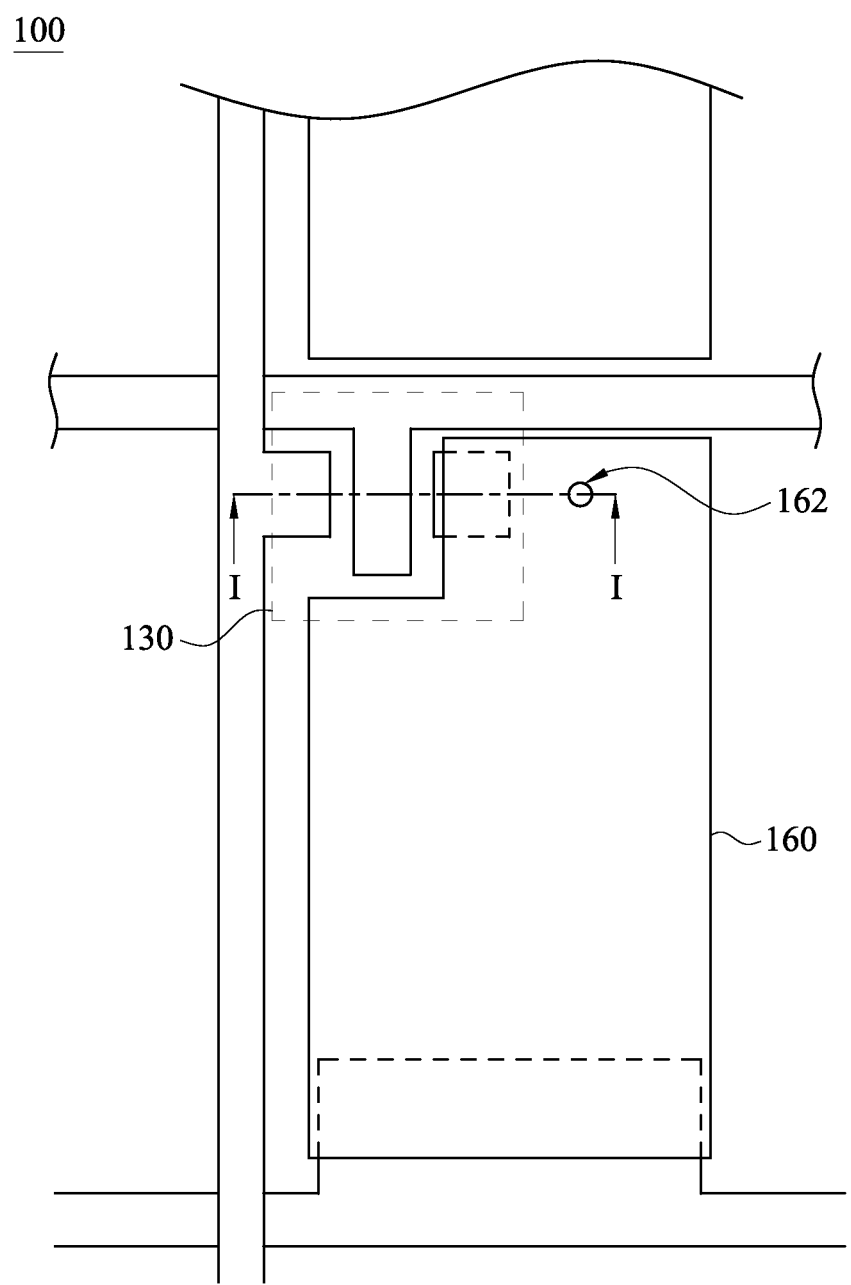
FIG. 1 is a top view of an active array substrate according to the first embodiment of this invention.

Reference will now be made in detail to the present embodiments of the invention, examples of which are illustrated in the accompanying drawings. To clarify this invention, some details for practice may be described in some embodiments. However, the person skilled in the art should understand these details may be not necessary for some other embodiments such that they should not to limit this invention. Besides, to simplify the drawings, some conventional structures or elements may be illustrated in a simple way. Wherever possible, the same reference numbers are used in the drawings and the description to refer to the same or like parts.

FIG. 1 is a top view of an active array substrate 100 according to the first embodiment of this invention. FIGS. 2A-2L are cross-sectional views of a manufacturing method of the active array substrate 100 taken along the line I-I of FIG. 1. It should be understood that the design of the active array substrate 100 in FIG. 1 is merely for explanation and does not tend to limit the claimed scope. A person having ordinary skill in the art may modify the design as required.

Figure 2A:
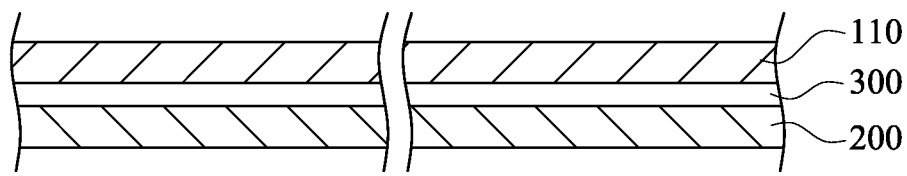
FIGS. 2A-2L are cross-sectional views of a manufacturing method of an active array substrate taken along the line I-I of FIG. 1.

Reference is made to FIG. 2A. A flexible substrate 110 may be formed on a carrier 200 with a photosensitive stripping layer 300 therebetween so as to perform sequent processes. In practice, the photosensitive stripping layer 300 may be formed on the carrier 200 by chemical vapor deposition (CVD) first. Then, the flexible substrate 110 may be formed on the photosensitive stripping layer 300 by spin-on coating. Of course, if the condition is proper, the flexible substrate 110 and the photosensitive stripping layer 300 may be attached to the carrier 200 by lamination.

In this embodiment, the carrier 200 may be made of any rigid material, for example, transparent glass. The thickness of the carrier 200 may be about 0.7 mm. The photosensitive stripping layer 300 may be made of an organic material which is sensitive to ultraviolet light or light with a specific wave band, for example, poly(p-xylylene) or parylene. The thickness of the photosensitive stripping layer 300 may be about 300 nm. The flexible substrate 110 may be made of any flexible material, for example, polyimide, polyethylene terephthalate, polyethylene naphthalate or any combination thereof. The thickness of the flexible substrate 110 may be in a range from about 10 μm to about 100 μm.

Figure 2B:
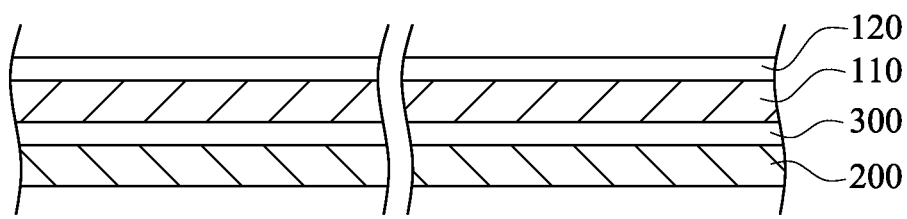

Reference is made to FIG. 2B. An inorganic barrier layer 120 is formed to cover the flexible substrate 110. The inorganic barrier layer 120 may be made of any inorganic dielectric material capable of blocking water and oxygen, for example, silicon nitride, silicon oxide, silicon oxynitride, or any combination thereof. The thickness of the inorganic barrier layer 120 may be in a range from about 10 nm to about 1000 nm. The inorganic barrier layer 120 may be formed by, for example, chemical vapor deposition (CVD).

Figure 2C:
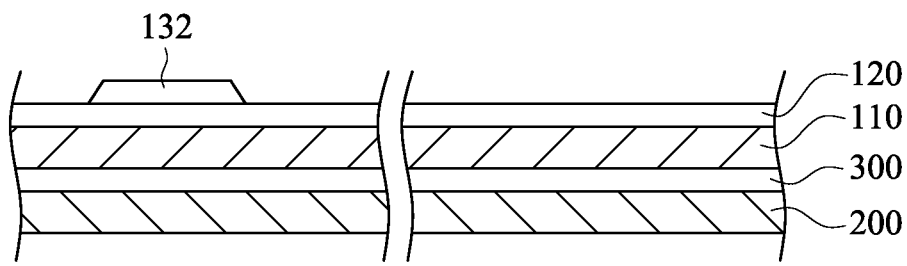

Reference is made to FIG. 2C. A gate electrode 132 is formed on the inorganic barrier layer 120. In practice, a first conductive layer is formed on the inorganic barrier layer 120 first, and then the first conductive layer is patterned to form the gate electrode 132.

In this embodiment, the first conductive layer (that is, the gate electrode 132) may be made of titanium, molybdenum, chromium, iridium, aluminum, copper, silver, gold, or any combination or alloy thereof. The thickness of the first conductive layer (that is, the gate electrode 132) may be in a range from about 10 nm to about 500 nm. The first conductive layer may be formed by physical vapor deposition (PVD), for example, sputtering. The first conductive layer may be patterned by photolithography and etching.

Figure 2D:
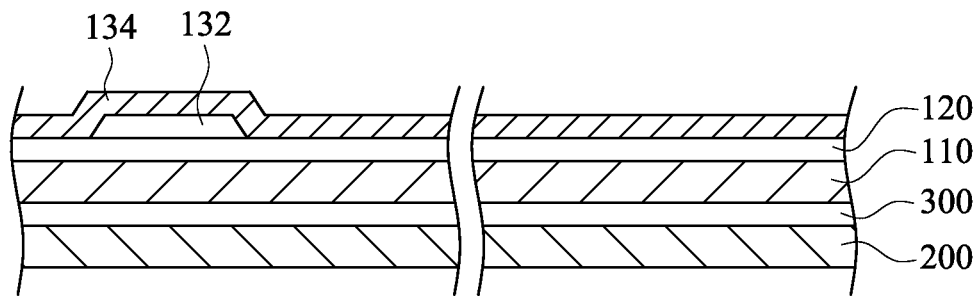

Reference is made to FIG. 2D. A gate dielectric layer 134 is formed to cover the gate electrode 132 and the inorganic barrier layer 120. The gate dielectric layer 134 may be made of any dielectric material, for example, silicon nitride, silicon oxide, silicon oxynitride, or any combination thereof. The thickness of the gate dielectric layer 134 may be in a range from about 100 nm to about 1000 nm. The gate dielectric layer 134 may be formed by, for example, chemical vapor deposition (CVD).

Figure 2E:
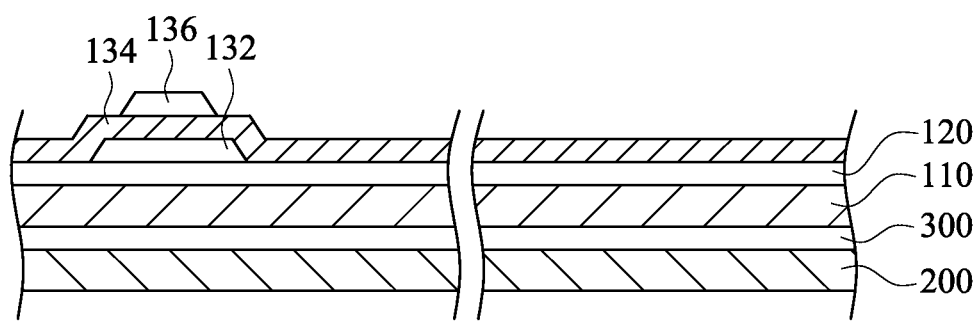

Reference is made to FIG. 2E. A channel layer 136 is formed on at least a portion of the gate dielectric layer 134 which is on the gate electrode 132. In practice, a semiconductor layer is formed on the gate dielectric layer 134 first, and then the semiconductor layer is patterned to form the channel layer 136.

The semiconductor layer (that is, the channel layer 136) may be made of any semiconductor material, for example, amorphous silicon, polysilicon, single-crystal silicon, oxide semiconductor, or any combination thereof. The thickness of the semiconductor layer (that is, the channel layer 136) may be in a range from about 10 nm to about 500 nm. The semiconductor layer may be formed by, for example, chemical vapor deposition (CVD). The semiconductor layer may be patterned by photolithography and etching.

Figure 2F:
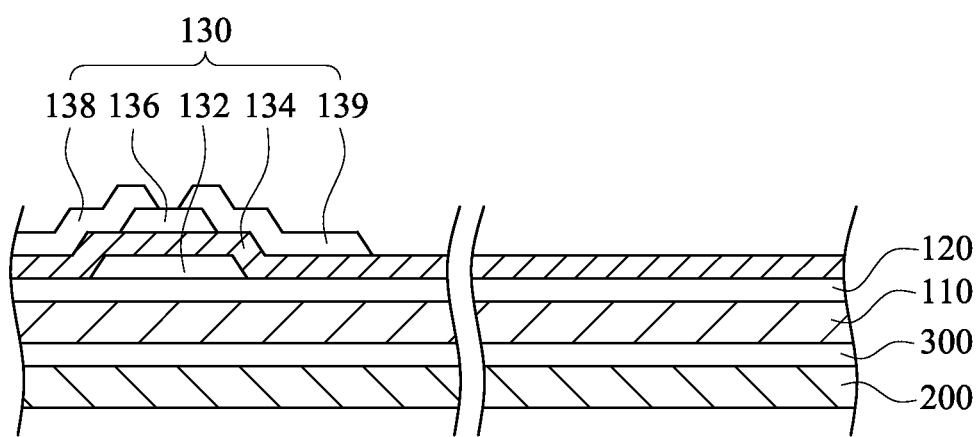

Reference is made to FIG. 2F. A source 138 and a drain 139 are formed on opposite sides of the channel layer 136. In practice, a second conductive layer may be formed on the channel layer 136 and the gate dielectric layer 134 first, and then the second conductive layer is patterned to form the source 138 and the drain 139.

In this embodiment, the second conductive layer (that is, the source 138 and the drain 139) may be made of titanium, molybdenum, chromium, iridium, aluminum, copper, silver, gold, or any combination or alloy thereof. The thickness of the second conductive layer (that is, the source 138 and the drain 139) may be in a range from about 10 nm to about 500 nm. The second conductive layer may be formed by physical vapor deposition (PVD), for example, sputtering. The second conductive layer may be patterned by photolithography and etching.

After the aforementioned steps are accomplished, an active component 130 having the gate electrode 132, the gate dielectric layer 134, the channel layer 136, the source 138, and the drain 139 is formed. It should be noted that the active component 130 is illustrated as a bottom gate thin film transistor in this embodiment, but the claimed scope is not limited to the transistor of this type. Actually, the active component 130 may be the transistor of other types, for example, a top gate thin film transistor. A person having ordinary skill in the art may choose a proper active component as required.

Figure 2G:
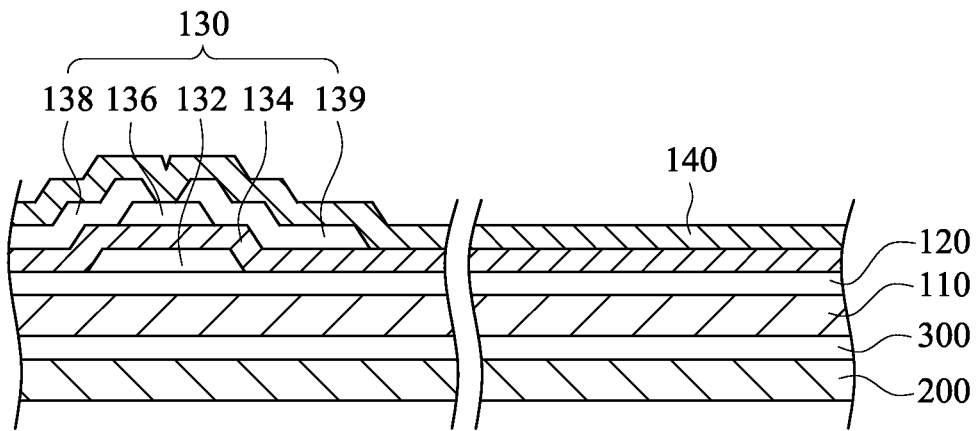

Reference is made to FIG. 2G. An inorganic protection layer 140 is formed to cover the active component 130. The inorganic protection layer 140 may be made of any inorganic dielectric material, for example, silicon nitride, silicon oxide, silicon oxynitride, or any combination thereof. The thickness of the inorganic protection layer 140 may be in a range from about 100 nm to about 1000 nm. The inorganic protection layer 140 may be formed by, for example, chemical vapor deposition (CVD).

Figure 2H:
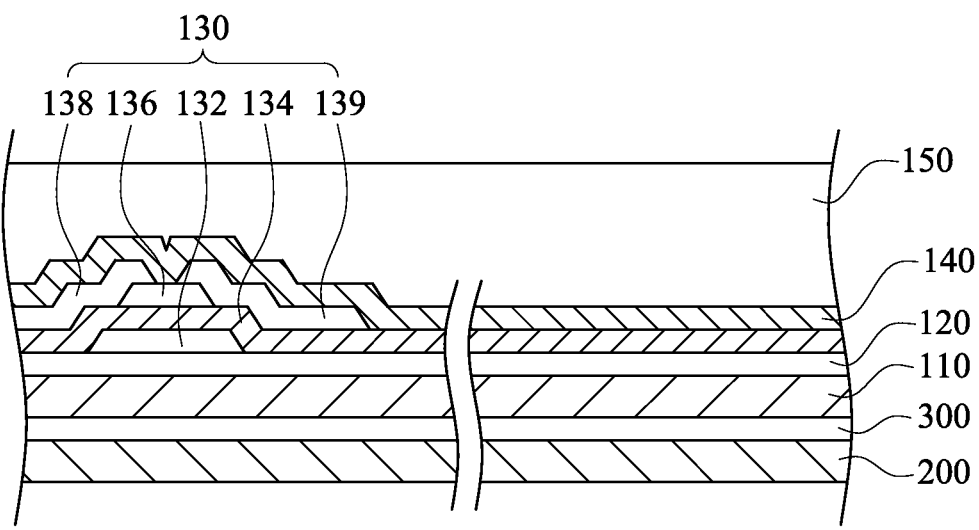

Reference is made to FIG. 2H. An organic protection layer 150 is formed to cover the active component 130. In this embodiment, the organic protection layer 150 covers the inorganic protection layer 140, but it does not tend to limit the claimed scope. If there are any other layers, for example, other dielectric layers or barrier layers, on the active component 130 or the inorganic protection layer 140, the organic protection layer 150 may also cover these layers. That is, the organic protection layer 150 may cover the inorganic protection layer 140 directly or indirectly.

The organic protection layer 150 may be made of any organic dielectric material, for example, acrylic polymer. The thickness of the organic protection layer 150 may be about 3 µm. The organic protection layer 150 may be formed by spin-on coating.

Figure 2I:
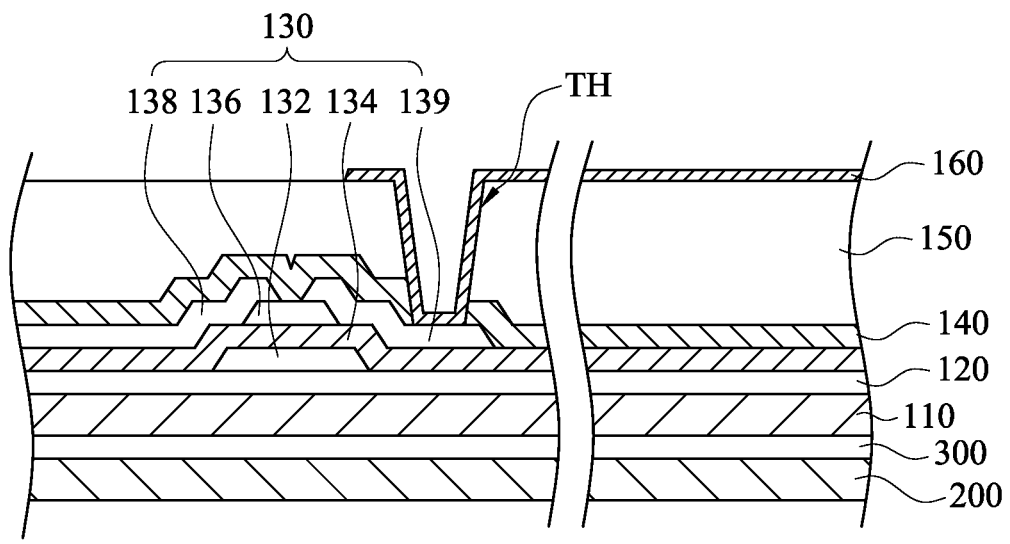

Reference is made to FIG. 2I. A pixel electrode 160 is formed, and the pixel electrode 160 is electrically connected to the active component 130. In practice, a pixel electrode through hole TH through the layers on the drain 139 is formed first to expose the drain 139. In this embodiment, because the layers on the drain 139 include the inorganic protection layer 140 and the organic protection layer 150, the pixel electrode through hole TH penetrates through the inorganic protection layer 140 and the organic protection layer 150 to expose the drain 139.

Then, a third conductive layer is formed to cover the organic protection layer 150 and the pixel electrode through hole TH. The third conductive layer is patterned to form the pixel electrode 160. The pixel electrode 160 is electrically connected to the drain 139 through the pixel electrode through hole TH.

The third conductive layer (that is, the pixel electrode 160) may be made of any conductive material. In this embodiment, the third conductive layer (that is, the pixel electrode 160) may be made of a transparent conductive material, for example, indium tin oxide, indium zinc oxide, aluminum zinc oxide, other conductive oxide, or any combination thereof. Otherwise, the third conductive layer (that is, the pixel electrode 160) may be made of other nontransparent conductive material, for example, titanium, molybdenum, chromium, iridium, aluminum, copper, silver, gold, or any combination or alloy thereof. The thickness of the third conductive layer (that is, the pixel electrode 160) may be in a range from about 10 nm to about 500 nm. The third conductive layer may be formed by physical vapor deposition (PVD) or chemical vapor deposition (CVD). The forming method of the pixel electrode through hole TH and the patterning method of the third conductive layer may be, for example, photolithography and etching.

Figure 2J:
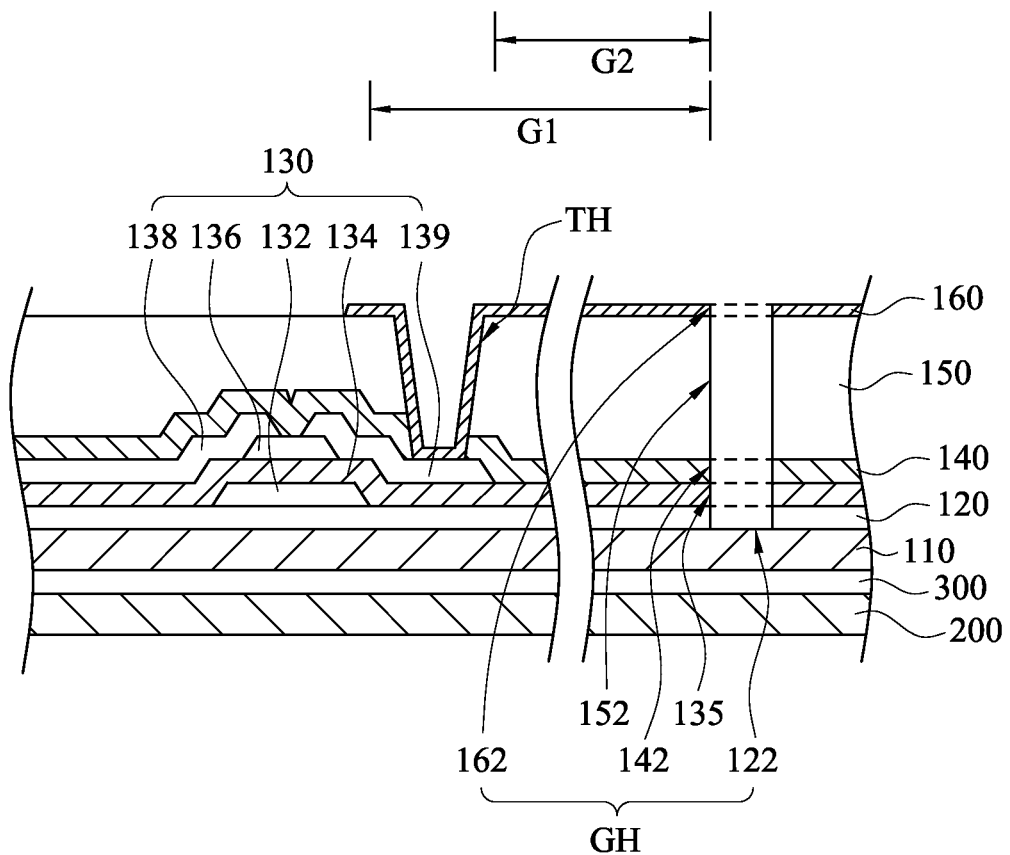

Reference is made to FIG. 2J. At least one gas hole GH is formed. The gas hole GH at least penetrates through the inorganic barrier layer 120 to expose the flexible substrate 110. In practice, in this embodiment, the position of the gas hole GH may be at the peripheral of the active component, that is, the position on the flexible substrate 110 where is located outside the gate electrode 132, the channel layer 136, the source 138, and the drain 139. The gas hole GH penetrates through the layers which are located above said position of the flexible substrate 110.

In this embodiment, the gas hole GH may penetrate through the pixel electrode 160, the organic protection layer 150, the inorganic protection layer 140, the gate dielectric layer 134 and the inorganic barrier layer 120 to expose the flexible substrate 110. That is, the through holes 162, 152, 142, 135, 122 are formed in the pixel electrode 160, the organic protection layer 150, the inorganic protection layer 140, the gate dielectric layer 134 and the inorganic barrier layer 120 respectively in this step. The gas hole GH includes the through holes 162, 152, 142, 135, 122. The gas hole GH may be formed by, for example, photolithography and etching.

Figure 2K:
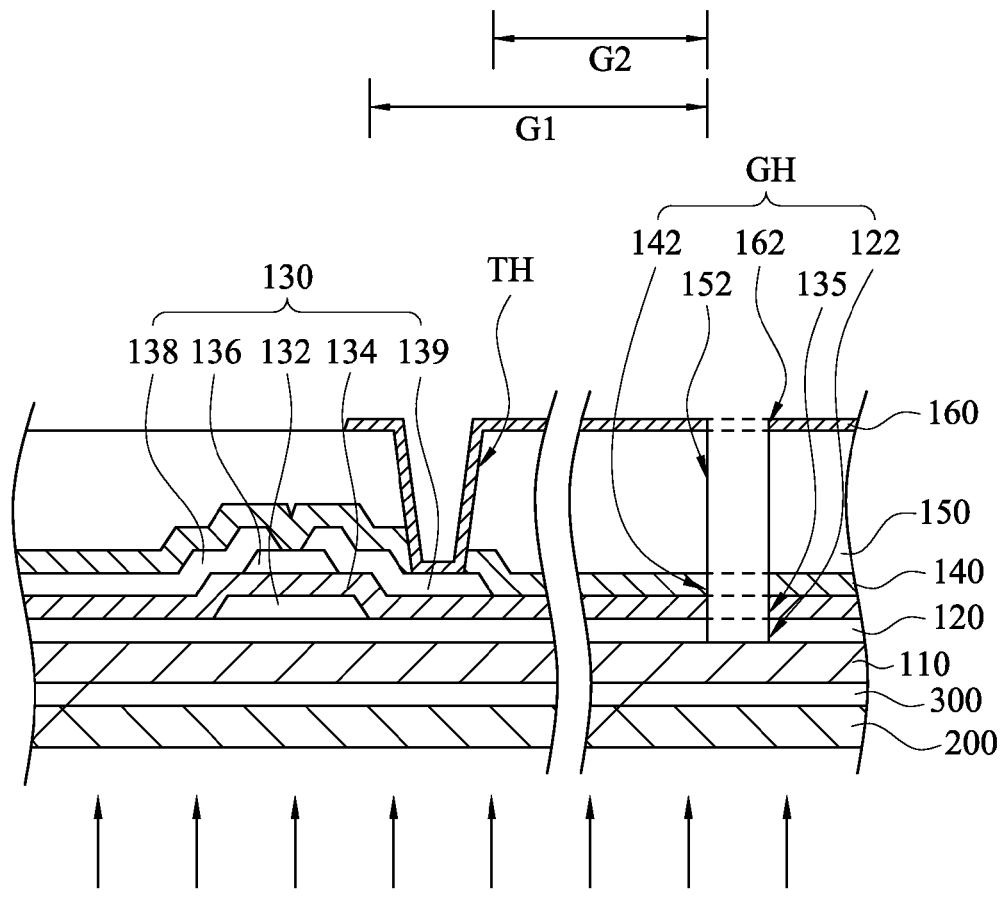

Reference is made to FIG. 2K. The photosensitive stripping layer 300 is irradiated by a light source so that the adhesion between the photosensitive stripping layer 300 and the carrier 200 is reduced after the photosensitive stripping layer 300 is photooxidated. In practice, the light source is disposed on the side of the carrier 200 opposite to the photosensitive stripping layer 300 so that the light penetrates through the carrier to the photosensitive stripping layer 300. In a traditional process, because the inorganic barrier layer is oxygen impermeable and without a gas hole, the oxygen may not penetrate through the inorganic barrier layer and not reach the surface of the photosensitive stripping layer adjacent to the flexible substrate even being oxygen permeable. Accordingly, the oxygen may be in contact with the photosensitive stripping layer only at the exposed side portions. However, in this embodiment, because of the gas hole GH, the oxygen may be in contact with the photosensitive stripping layer 300 not only at the exposed side portions but also on the surface adjacent to the flexible substrate 110 through the gas hole GH and the flexible substrate 110. Therefore, the photooxidation of the photosensitive stripping layer 300 is faster, and thus the time required to manufacture the active array substrate 100 is reduced.

The light source may be an ultraviolet light source, for example, an ultraviolet A (UVA) light source, an ultraviolet B (UVB) light source, an ultraviolet C (UVC) light source or other light source capable of photooxidating the photosensitive stripping layer 300. Moreover, if the light source is disposed on the back side of the carrier 200 and irradiates the photosensitive stripping layer 300 by back exposing, the carrier 200 may be transparent to the light source, for example, transparent glass.

Figure 2L:
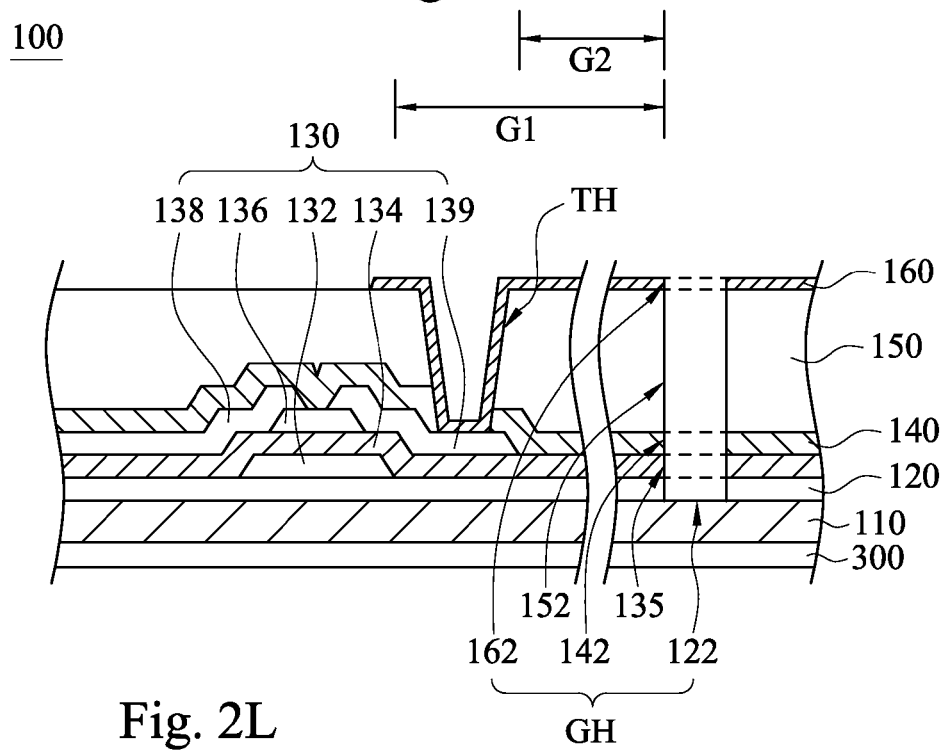

Reference is made to FIG. 2L. The flexible substrate 110 and the photosensitive stripping layer 300 are stripped from the carrier 200 so that the active array substrate 100 is obtained. In the view of structure, the active array substrate 100 in FIG. 2L includes the flexible substrate 110, the inorganic barrier layer 120 and at least one active component 130. The inorganic barrier layer 120 covers the flexible substrate 110. The inorganic barrier layer 120 has at least one through hole 122 therein. The through hole 122 of the inorganic barrier layer 120 exposes the flexible substrate 110. The active component 130 is disposed on the inorganic barrier layer 120. Furthermore, the active array substrate 100 further includes the photosensitive stripping layer 300. The photosensitive stripping layer 300 is disposed on the surface of the flexible substrate 110 opposite to the inorganic barrier layer 120.

In FIG. 2L, the active component 130 may include the gate electrode 132, the gate dielectric layer 134, the channel layer 136, the source 138 and the drain 139. The gate electrode 132 is disposed on the inorganic barrier layer 120. The gate dielectric layer 134 covers the gate electrode 132 and the inorganic barrier layer 120. The gate dielectric layer 134 has at least one through hole 135 therein and the through hole 135 of the gate dielectric layer 134 is connected to the through hole 122 of the inorganic barrier layer 120. That is, the vertical projection of the through hole 135 on the flexible substrate 110 overlaps with the vertical projection of the through hole 122 on the flexible substrate 110. The channel layer 136 is disposed on at least a portion of the gate dielectric layer 134 that is on the gate electrode 132. The source 138 and the drain 139 are located on the opposite sides of the channel layer 136 respectively.

In this embodiment, the through hole 122 of the inorganic barrier layer 120 is a part of the gas hole GH. The position of the gas hole GH may be at the position on the flexible substrate 110 where is located outside the gate electrode 132, the channel layer 136, the source 138, and the drain 139. Therefore, there is a space (as indicated by the space G1) between the through hole 122 of the inorganic barrier layer 120 and the gate electrode 132. In practice, the vertical projection of the through hole 122 on the flexible substrate 110 does not overlap with those of the gate electrode 132, the channel layer 136, the source 138, and the drain 139.

Moreover, the through hole 135 of the gate dielectric layer 134 is a part of the gas hole GH, too. The position of the gas hole GH may be at the position on the flexible substrate 110 where is located outside the gate electrode 132, the channel layer 136, the source 138, and the drain 139. Therefore, there is a space (as indicated by the space G1) between the through hole 135 of the gate dielectric layer 134 and the gate electrode 132. In practice, the vertical projection of the through hole 135 on the flexible substrate 110 does not overlap with those of the gate electrode 132, the channel layer 136, the source 138, and the drain 139.

In FIG. 2L, the active array substrate 100 further includes the inorganic protection layer 140. The inorganic protection layer 140 covers the active component 130 and has at least one through hole 142 therein. The through hole 142 of the inorganic protection layer 140 is a part of the gas hole GH, too. Thus, the through hole 142 of the inorganic protection layer 140 is connected to the through hole 135 of the gate dielectric layer 134 and the through hole 122 of the inorganic barrier layer 120. In other words, the vertical projection of the through hole 142 on the flexible substrate 110 overlaps with the vertical projection of the through hole 122 on the flexible substrate 110. Furthermore the vertical projection of the through hole 142 on the flexible substrate 110 overlaps with the vertical projection of the through hole 135 on the flexible substrate 110.

In this embodiment, the position of the gas hole GH may be at the position on the flexible substrate 110 where is located outside the gate electrode 132, the channel layer 136, the source 138, and the drain 139. Therefore, there is a space (as indicated by the space G2) between the through hole 142 of the inorganic protection layer 140 and the drain 139 of the active component 130. In practice, the vertical projection of the through hole 142 on the flexible substrate 110 does not overlap with those of the gate electrode 132, the channel layer 136, the source 138, and the drain 139.

In FIG. 2L, the active array substrate 100 further includes the organic protection layer 150. The organic protection layer 150 covers the active component 130. In this embodiment, the organic protection layer 150 covers the inorganic protection layer 140 and has a through hole 152 therein. The through hole 152 of the organic protection layer 150 is a part of the gas hole GH, too. Thus, the through hole 152 of the organic protection layer 150 is connected to the through hole 142 of the inorganic protection layer 140, the through hole 135 of the gate dielectric layer 134, and the through hole 122 of the inorganic barrier layer 120. In other words, the vertical projection of the through hole 152 on the flexible substrate 110 overlaps with the vertical projection of the through hole 122 on the flexible substrate 110. Furthermore the vertical projection of the through hole 152 on the flexible substrate 110 overlaps with the vertical projection of the through hole 135 on the flexible substrate 110. The vertical projection of the through hole 152 on the flexible substrate 110 overlaps with the vertical projection of the through hole 142 on the flexible substrate 110.

In this embodiment, the position of the gas hole GH may be at the position on the flexible substrate 110 where is located outside the gate electrode 132, the channel layer 136, the source 138, and the drain 139. Therefore, there is a space (as indicated by the space G2) between the through hole 152 of the organic protection layer 150 and the drain 139 of the active component 130. In practice, the vertical projection of the through hole 152 on the flexible substrate 110 does not overlap with those of the gate electrode 132, the channel layer 136, the source 138, and the drain 139.

In FIG. 2L, the active array substrate 100 further includes the pixel electrode 160. The pixel electrode 160 is disposed on the active component 130 and is electrically connected to the active component 130. In this embodiment, the pixel electrode 160 covers the organic protection layer 150 and has a through hole 162 therein. The through hole 162 of the pixel electrode 160 is a part of the gas hole GH, too. Thus, the through hole 162 of the pixel electrode 160 is connected to the through hole 152 of the organic protection layer 150, the through hole 142 of the inorganic protection layer 140, the through hole 135 of the gate dielectric layer 134 and the through hole 122 of the inorganic barrier layer 120. In other words, the vertical projection of the through hole 162 on the flexible substrate 110 overlaps with the vertical projection of the through hole 122 on the flexible substrate 110. Furthermore the vertical projection of the through hole 162 on the flexible substrate 110 overlaps with the vertical projection of the through hole 135 on the flexible substrate 110. The vertical projection of the through hole 162 on the flexible substrate 110 overlaps with the vertical projection of the through hole 142 on the flexible substrate 110. The vertical projection of the through hole 162 on the flexible substrate 110 overlaps with the vertical projection of the through hole 152 on the flexible substrate 110.

In this embodiment, the position of the gas hole GH may be at the position on the flexible substrate 110 where is located outside the gate electrode 132, the channel layer 136, the source 138, and the drain 139. Therefore, the vertical projection of the through hole 162 on the flexible substrate 110 does not overlap with those of the gate electrode 132, the channel layer 136, the source 138, and the drain 139.

FIGS. 3A-3D are cross-sectional views of a manufacturing method of an active array substrate 100 with the same cross-section as FIGS. 2A-2J according to the second embodiment of this invention. The difference between this embodiment and the first embodiment is that after the photosensitive stripping layer 300 is photooxidated, an inorganic filling material 170 is formed in the gas hole GH to protect the layers exposed by the gas hole GH.

Figure 3A:
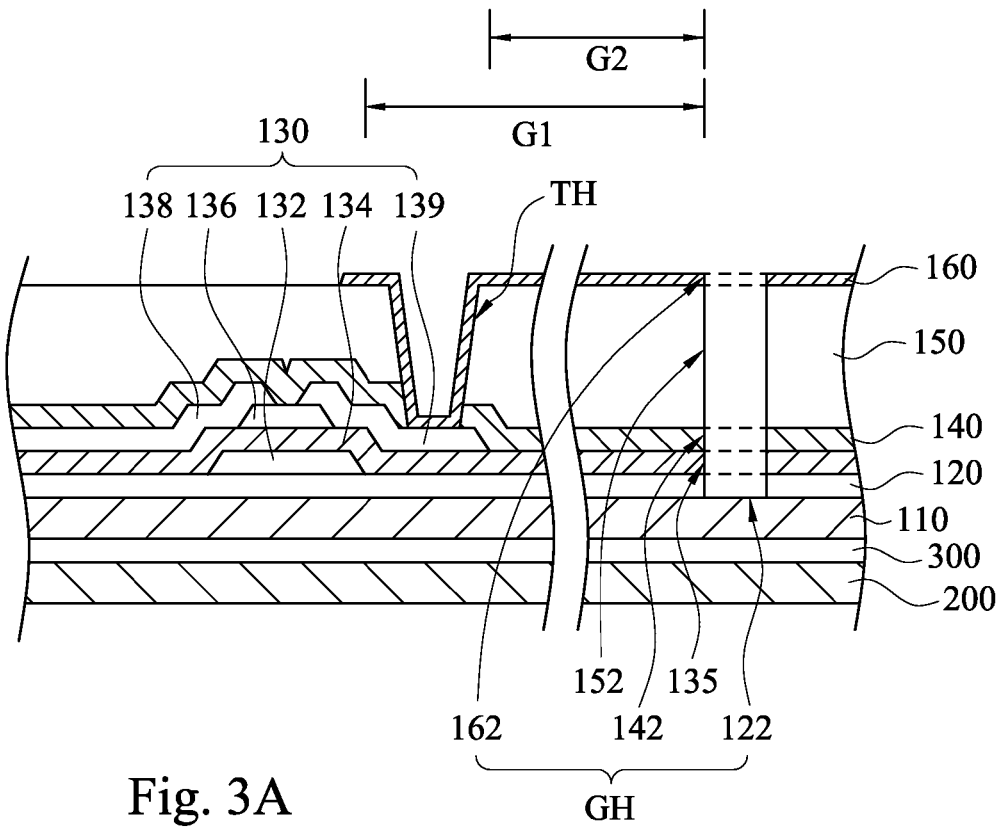
FIGS. 3A-3D are cross-sectional views of a manufacturing method of an active array substrate with the same cross-section as FIGS. 2A-2J according to the second embodiment of this invention.

Reference is made to FIG. 3A first. The steps as shown in FIGS. 2A-2J are performed. Because the process, the material, and the detailed structure are the same as those in the first embodiment, they are not repeated herein.

Figure 3B:
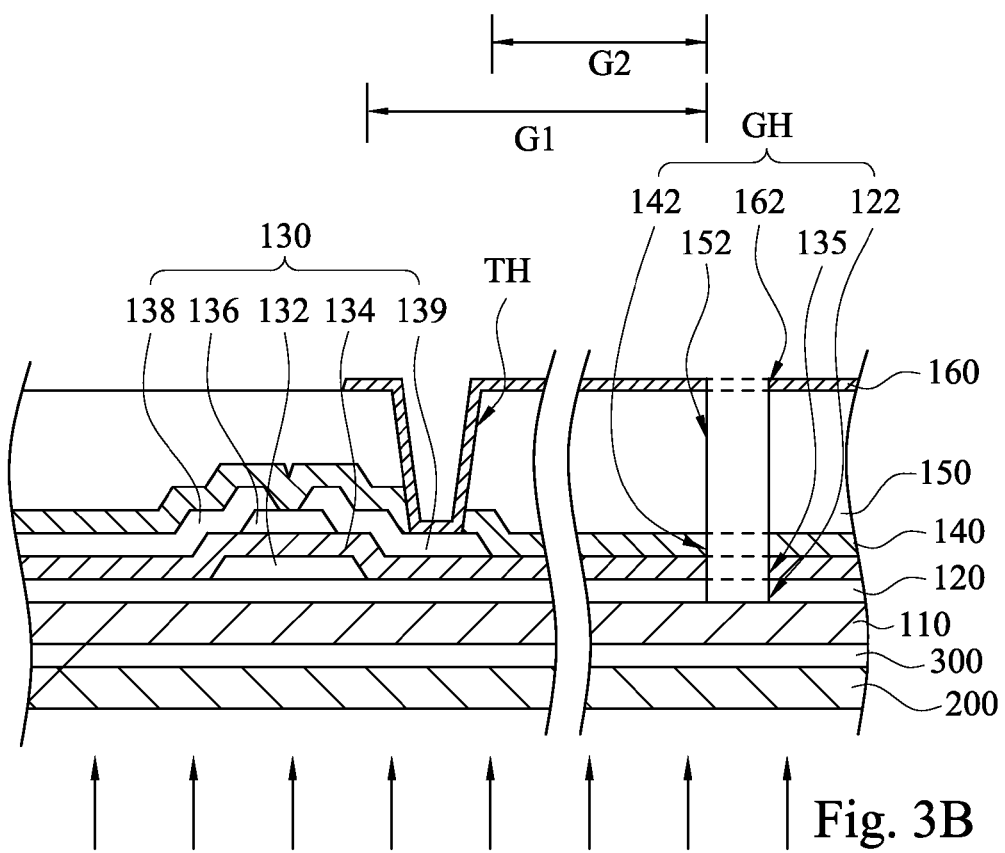

Reference is made to FIG. 3B. The photosensitive stripping layer 300 is irradiated by a light source so that the adhesion between the photosensitive stripping layer 300 and the carrier 200 is reduced after the photosensitive stripping layer 300 is photooxidated. Similarly, because of the gas hole GH, the oxygen may be in contact with the photosensitive stripping layer 300 not only at the exposed side portions but also on the surface adjacent to the flexible substrate 110 through the gas hole GH and the flexible substrate 110. Therefore, the photooxidation of the photosensitive stripping layer 300 is faster, and thus the time required to manufacture the active array substrate 100 is reduced.

Figure 3C:
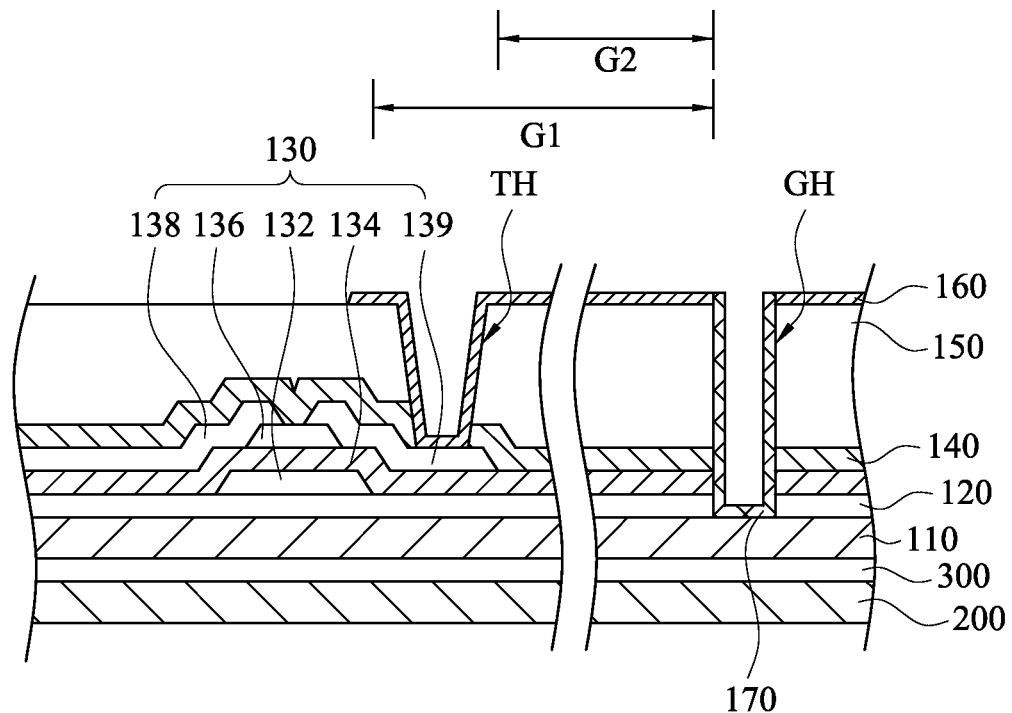

Reference is made to FIG. 3C. The inorganic filling material 170 is formed in the gas hole GH. In practice, the inorganic filling material 170 is formed first and covers the organic protection layer 150 and the pixel electrode 160. The inorganic filling material 170 conformally covers the gas hole GH. Then, the portion of the inorganic filling material 170 outside the gas hole GH is removed to form the inorganic filling material 170 as shown in FIG. 3C.

During the formation of the inorganic filling material 170, the photosensitive stripping layer 300 is photooxidated, so the inorganic filling material 170 may be formed by a low-temperature process, for example, plasma-enhanced CVD or low-temperature vacuum sputtering. The inorganic filling material 170 may be made of an inorganic dielectric material (e.g. silicon nitride, silicon oxide, silicon oxynitride, or any combination thereof) or metal (e.g. titanium, molybdenum, chromium, iridium, aluminum, copper, silver, gold, or any combination or alloy thereof). The portion of the inorganic filling material 170 outside the gas hole GH may be removed by etching.

Figure 3D:
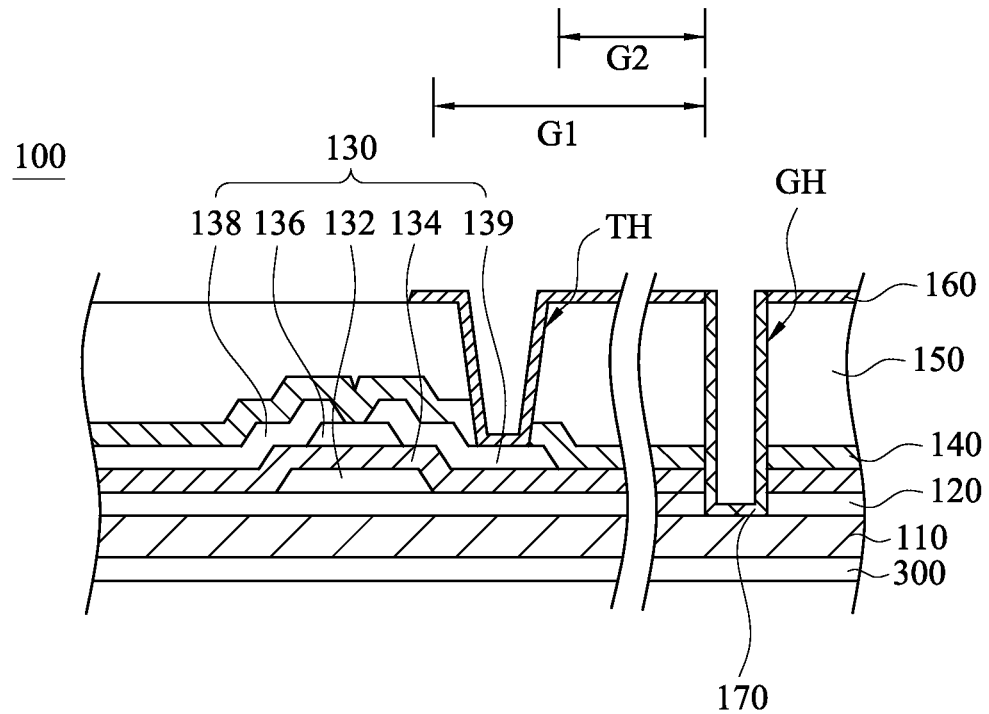

Reference is made to FIG. 3D. The flexible substrate 110 and the photosensitive stripping layer 300 are stripped from the carrier 200 so that the active array substrate 100 is obtained. In the view of structure, the difference between the active array substrate 100 in FIG. 3D and that in the first embodiment is that the active array substrate 100 in FIG. 3D further includes the inorganic filling material 170 which at least conformally covers the through hole 122 (as shown in FIG. 3B) of the inorganic barrier layer 120. In this embodiment, the inorganic filling material 170 conformally covers the gas hole GH, that is, the inorganic filling material 170 conformally covers the through hole 122 (as shown in FIG. 3B) of the inorganic barrier layer 120, the through hole 135 (as shown in FIG. 3B) of the gate dielectric layer 134, the through hole 142 (as shown in FIG. 3B) of the inorganic protection layer 140, the through hole 152 (as shown in FIG. 3B) of the organic protection layer 150, and the through hole 162 (as shown in FIG. 3B) of the pixel electrode 160. Moreover, in some embodiments, the inorganic filling material 170 may merely conformally cover a part of the gas hole GH. For example, the inorganic filling material 170 may merely conformally cover the through hole 122 (as shown in FIG. 3B) of the inorganic barrier layer 120. The person having ordinary skill in this art may select a proper implement of the inorganic filling material 170 as required.

FIGS. 4A-4G are cross-sectional views of a manufacturing method of an active array substrate 100 with the same cross-section as FIGS. 2A-2G according to the third embodiment of this invention. The difference between this embodiment and the first embodiment is that the step of forming the inorganic protection layer 140 is followed by the step of forming the gas hole GH, then the photosensitive stripping layer 300 is photooxidated, and then the sequent processes are performed.

Figure 4A:
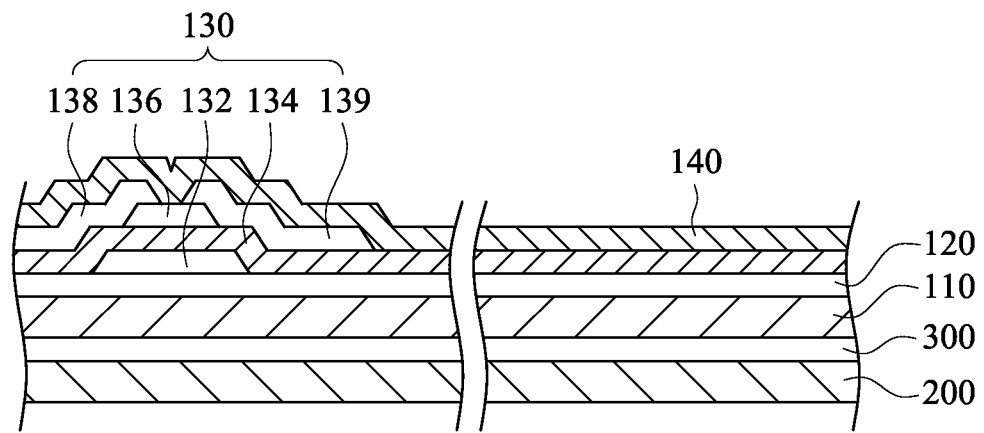
FIGS. 4A-4G are cross-sectional views of a manufacturing method of an active array substrate with the same cross-section as FIGS. 2A-2G according to the third embodiment of this invention.

Reference is made to FIG. 4A. The steps as shown in FIGS. 2A-2G are performed. Because the process, the material, and the detailed structure are the same as those in the first embodiment, they are not repeated herein.

Figure 4B:
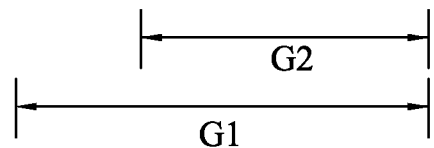
Figure 4B:
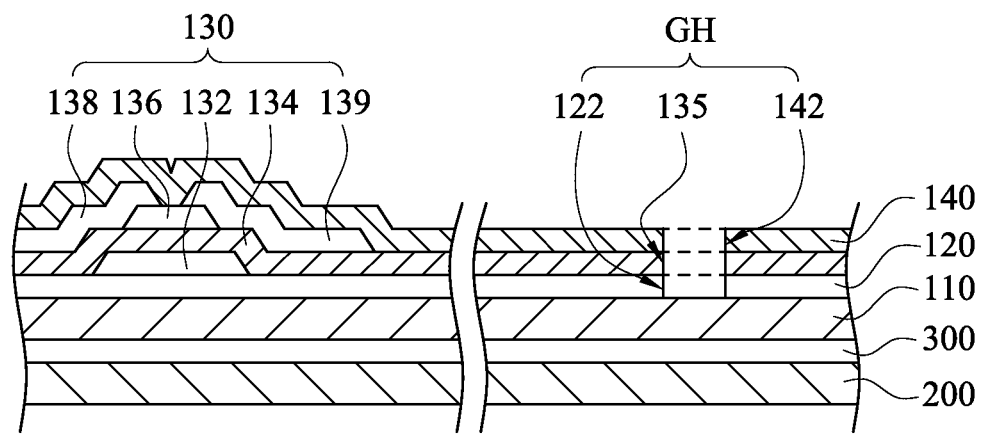

Reference is made to FIG. 4B. At least one gas hole GH is formed. The difference from the first embodiment is that in this embodiment, the gas hole GH may merely penetrate through the inorganic protection layer 140, the gate dielectric layer 134, and the inorganic barrier layer 120 to expose the flexible substrate 110 because the layers on the flexible substrate 110 only includes the inorganic protection layer 140, the gate dielectric layer 134, and the inorganic barrier layer 120.

Figure 4C:
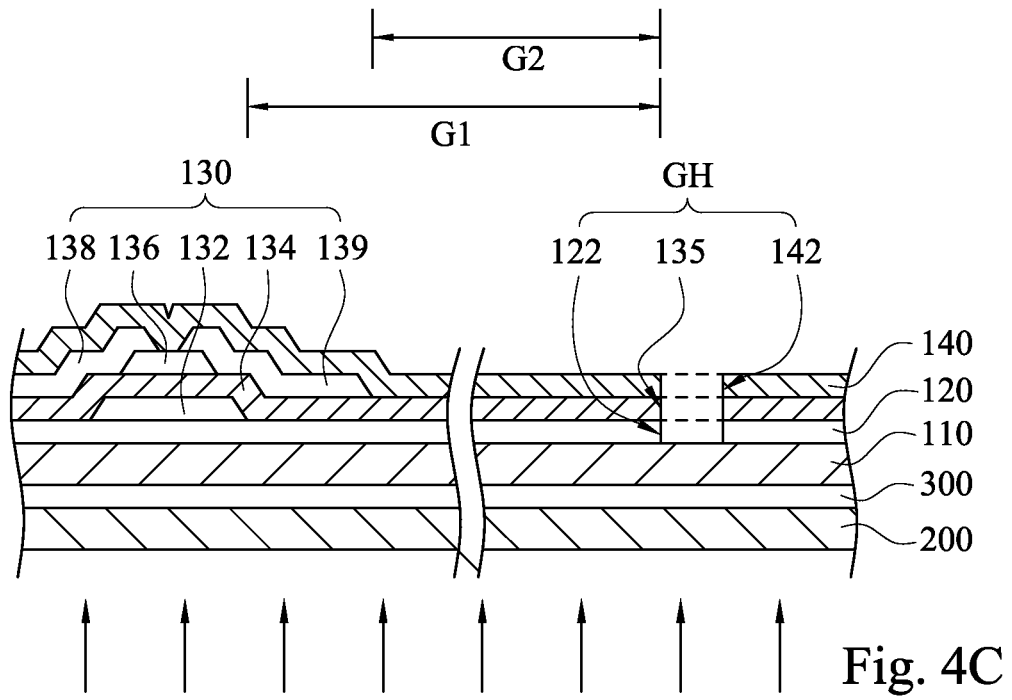

Reference is made to FIG. 4C. The photosensitive stripping layer 300 is irradiated by a light source so that the adhesion between the photosensitive stripping layer 300 and the carrier 200 is reduced after the photosensitive stripping layer 300 is photooxidated. Similarly, because of the gas hole GH, the oxygen may be in contact with the photosensitive stripping layer 300 not only at the exposed side portions but also on the surface adjacent to the flexible substrate 110 through the gas hole GH and the flexible substrate 110. Therefore, the photooxidation of the photosensitive stripping layer 300 is faster, and thus the time required to manufacture the active array substrate 100 is reduced.

Figure 4D:
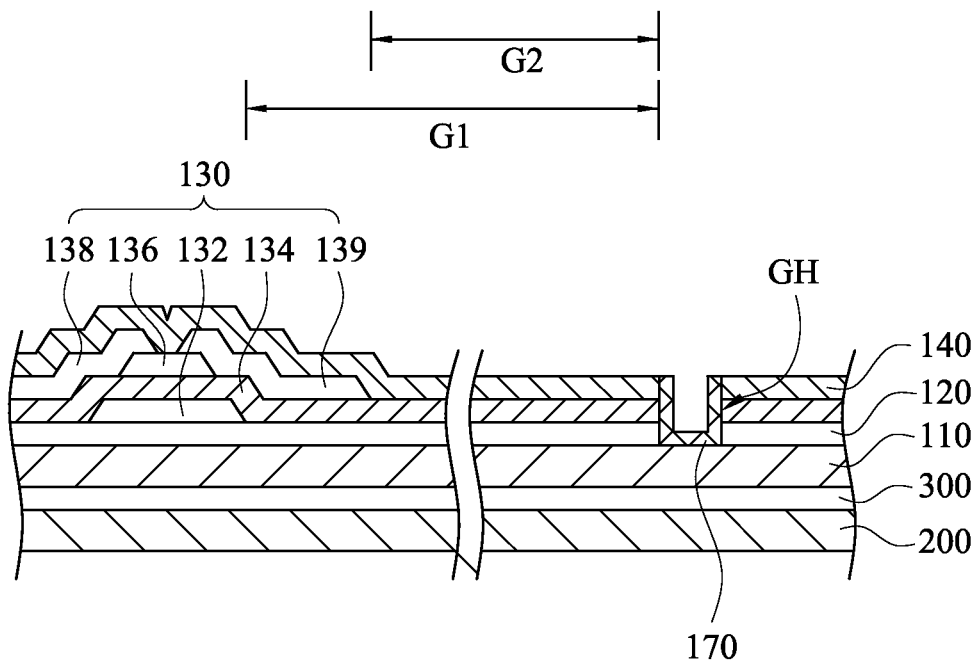

Reference is made to FIG. 4D. The inorganic filling material 170 is formed in the gas hole GH. In practice, the inorganic filling material 170 is formed first and covers the inorganic protection layer 140. The inorganic filling material 170 conformally covers the gas hole GH. Then, the portion of the inorganic filling material 170 outside the gas hole GH is removed to form the inorganic filling material 170 as shown in FIG. 4D.

Similarly, during the formation of the inorganic filling material 170, the photosensitive stripping layer 300 is photooxidated, so the inorganic filling material 170 may be formed by a low-temperature process, for example, plasma-enhanced CVD or low-temperature vacuum sputtering. The inorganic filling material 170 may be made of an inorganic dielectric material (e.g. silicon nitride, silicon oxide, silicon oxynitride, or any combination thereof) or metal (e.g. titanium, molybdenum, chromium, iridium, aluminum, copper, silver, gold, or any combination or alloy thereof). The portion of the inorganic filling material 170 outside the gas hole GH may be removed by etching.

Figure 4E:
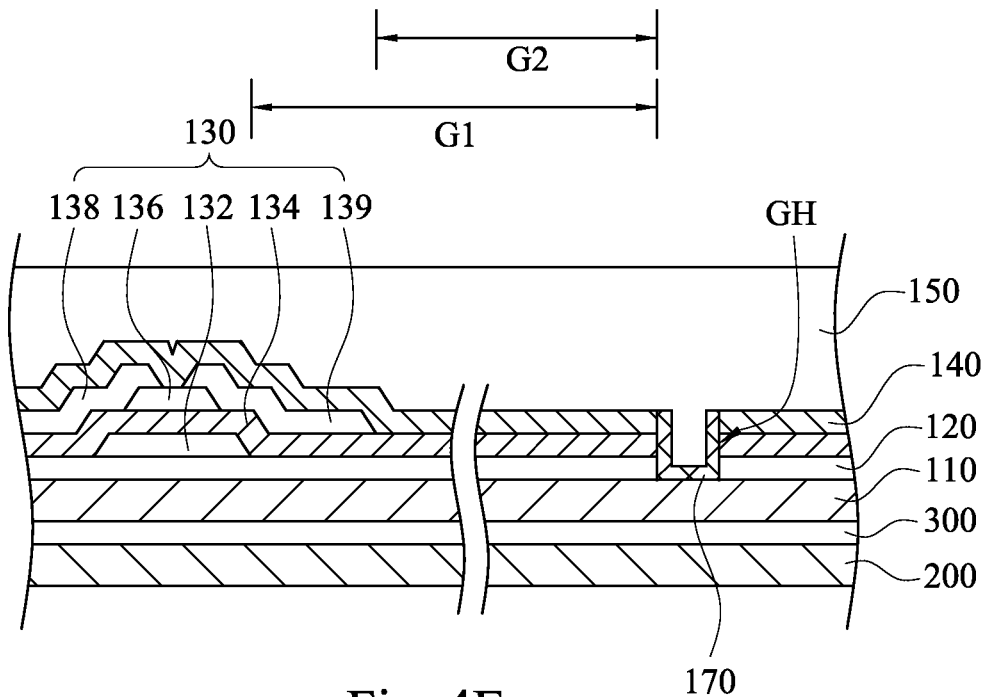

Reference is made to FIG. 4E. The organic protection layer 150 is formed. The organic protection layer 150 covers the inorganic protection layer 140 and the inorganic filling material 170. Because the process, the material and the detailed structure related to the organic protection layer 150 are the same as those in the first embodiment, they are not repeated herein.

Figure 4F:
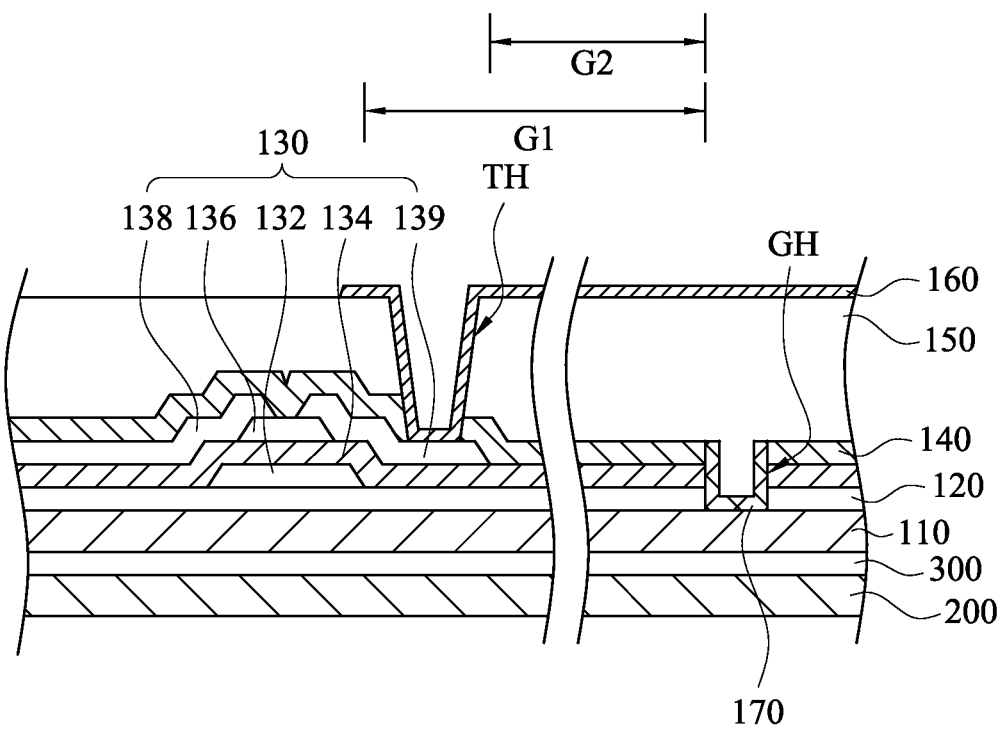

Reference is made to FIG. 4F. The pixel electrode 160 is formed on the active component 130 and is electrically connected to the active component 130. In practice, a pixel electrode through hole TH is formed first, and the pixel electrode through hole TH penetrates through the layers on the drain 139 to expose the drain 139. In this embodiment, because the layers on the drain 139 include the inorganic protection layer 140 and the organic protection layer 150, the pixel electrode through hole TH penetrates through the inorganic protection layer 140 and the organic protection layer 150 to expose the drain 139.

Then, the third conductive layer is formed to cover the organic protection layer 150 and the pixel electrode through hole TH. The third conductive layer is patterned to form the pixel electrode 160. The pixel electrode 160 is electrically connected to the drain 139 through the pixel electrode through hole TH.

During the formation of the third conductive layer, the photosensitive stripping layer 300 has been photooxidated, so the third conductive layer may be formed by a low-temperature process, for example, plasma-enhanced CVD or low-temperature vacuum sputtering. The third conductive layer (that is, the pixel electrode 160) may be made of a transparent conductive material, for example, indium tin oxide, indium zinc oxide, aluminum zinc oxide, other conductive oxide, or any combination thereof. Otherwise, the third conductive layer (that is, the pixel electrode 160) may be made of other nontransparent conductive material, for example, titanium, molybdenum, chromium, iridium, aluminum, copper, silver, gold, or any combination or alloy thereof. The thickness of the third conductive layer (that is, the pixel electrode 160) may be in a range from about 10 nm to about 500 nm. The forming method of the pixel electrode through hole TH and the patterning method of the third conductive layer may be, for example, photolithography and etching.

Figure 4G:
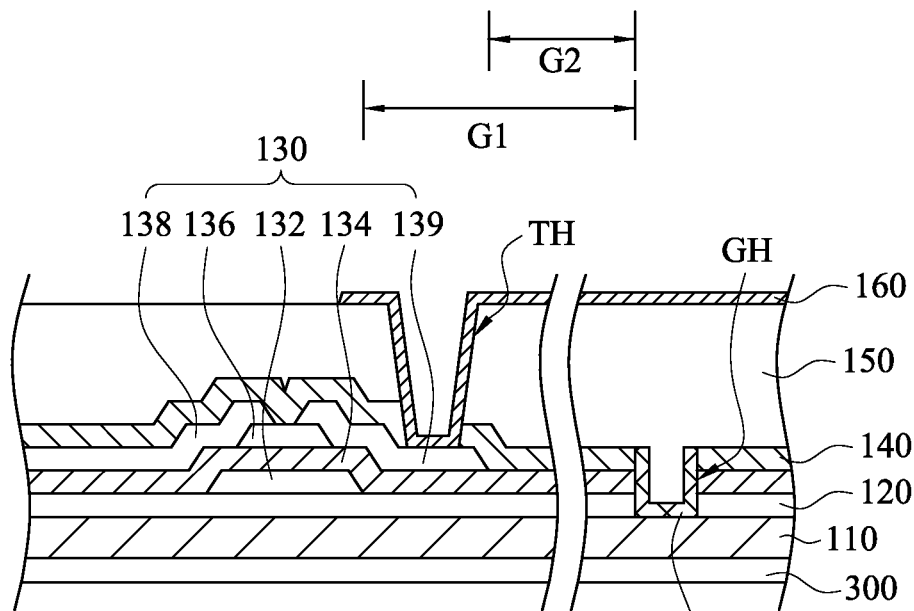

Reference is made to FIG. 4G. The flexible substrate 110 and the photosensitive stripping layer 300 are stripped from the carrier 200 so that the active array substrate 100 is obtained. In the view of structure, the difference between the active array substrate 100 in FIG. 4G and that in the first embodiment is that the gas hole GH in FIG. 4G only penetrates through the inorganic barrier layer 120, the gate dielectric layer 134, and the inorganic protection layer 140 but does not penetrate through the organic protection layer 150 and the pixel electrode 160. Besides, the active array substrate 100 in FIG. 4G further includes the inorganic filling material 170. The inorganic filling material 170 conformally covers the gas hole GH.

Because the inorganic filling material 170 conformally covers the gas hole GH, the organic protection layer 150 and the pixel electrode 160 both cover the gas hole GH. That is, the organic protection layer 150 and the pixel electrode 160 both cover the through hole 122 of the inorganic barrier layer 120, the through hole 135 of the gate dielectric layer 134, and the through hole 142 of the inorganic protection layer 140.

FIGS. 5A-5E are cross-sectional views of a manufacturing method of an active array substrate 100 with the same cross-section as FIGS. 4A-4B according to the fourth embodiment of this invention. The difference between this embodiment and the third embodiment is that after the photosensitive stripping layer 300 is photooxidated, the inorganic filling material 170 may not be formed in the gas hole GH, but at least one portion of the organic protection layer 150 is filled in the gas hole GH.

Figure 5A:
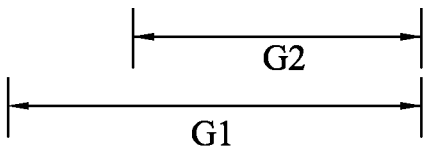
FIGS. 5A-5E are cross-sectional views of a manufacturing method of an active array substrate with the same cross-section as FIGS. 4A-4B according to the fourth embodiment of this invention.
Figure 5A:
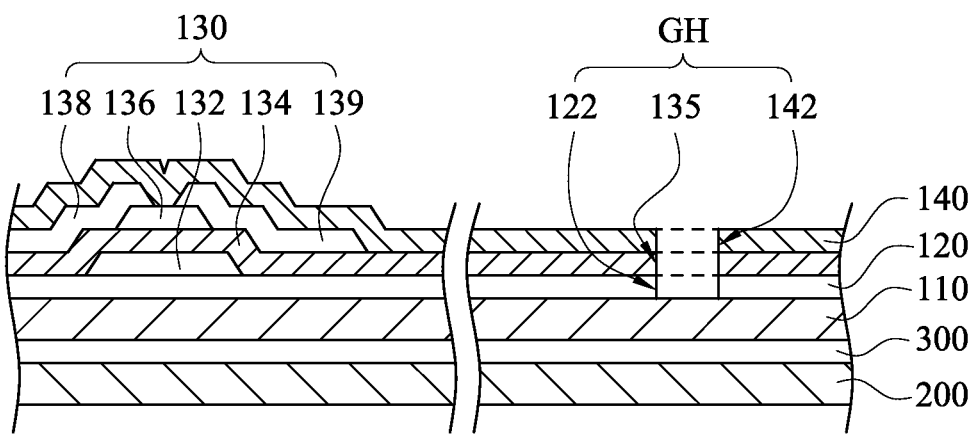

Reference is made to FIG. 5A. The steps as shown in FIGS. 4A-4B are performed. Because the process, the material, and the detailed structure are the same as those in the third embodiment, they are not repeated herein.

Figure 5B:
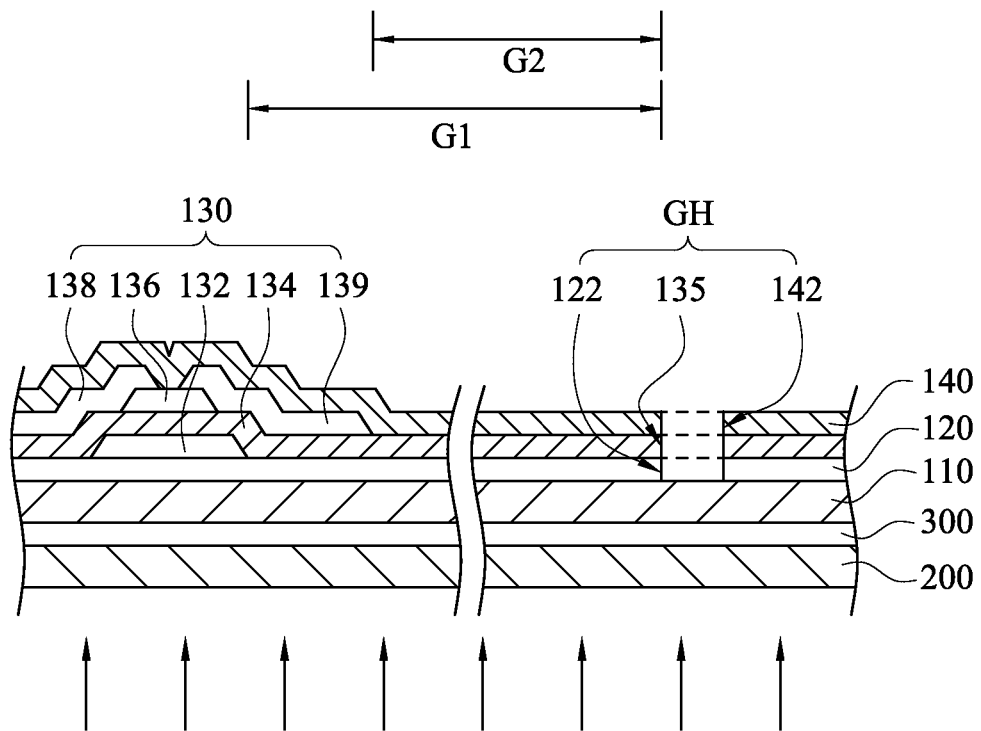

Then, reference is made to FIG. 5B. The photosensitive stripping layer 300 is irradiated by a light source so that the adhesion between the photosensitive stripping layer 300 and the carrier 200 is reduced after the photosensitive stripping layer 300 is photooxidated. Similarly, because of the gas hole GH, the oxygen may be in contact with the photosensitive stripping layer 300 not only at the exposed side portions but also on the surface adjacent to the flexible substrate 110 through the gas hole GH and the flexible substrate 110. Therefore, the photooxidation of the photosensitive stripping layer 300 is faster, and thus the time required to manufacture the active array substrate 100 is reduced.

Figure 5C:
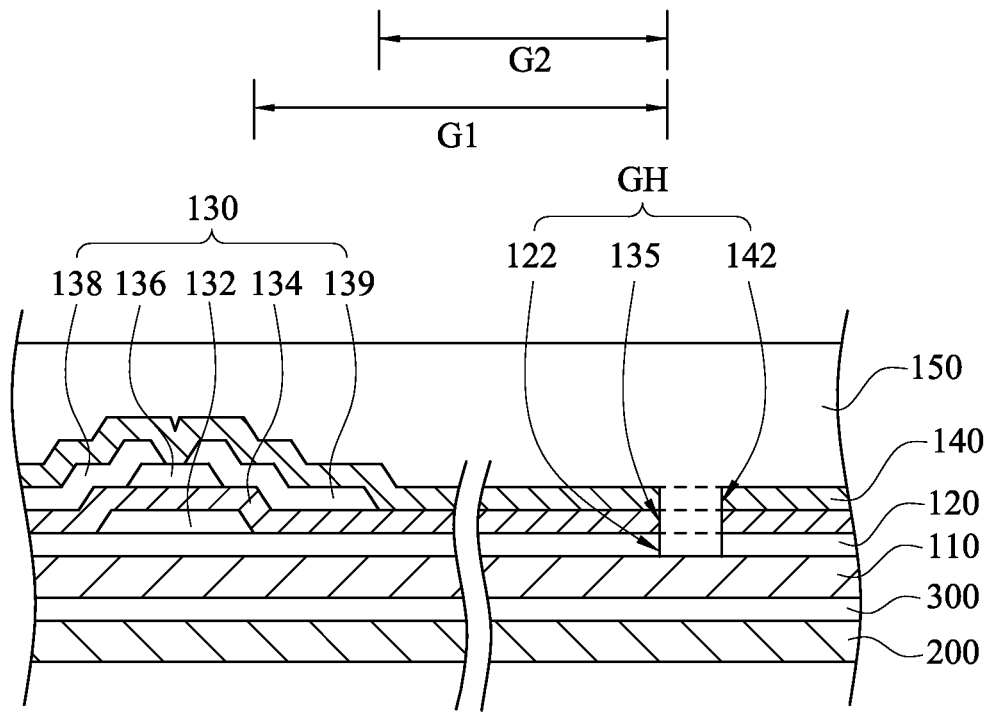

Reference is made to FIG. 5C. The organic protection layer 150 is formed. The organic protection layer 150 covers the inorganic protection layer 140, and at least one portion of the organic protection layer 150 is filled in the gas hole GH.

The organic protection layer 150 may be made of any organic dielectric material, for example, acrylic polymer. The thickness of the organic protection layer 150 may be about 3 µm. The organic protection layer 150 may be formed by spin-on coating.

Figure 5D:
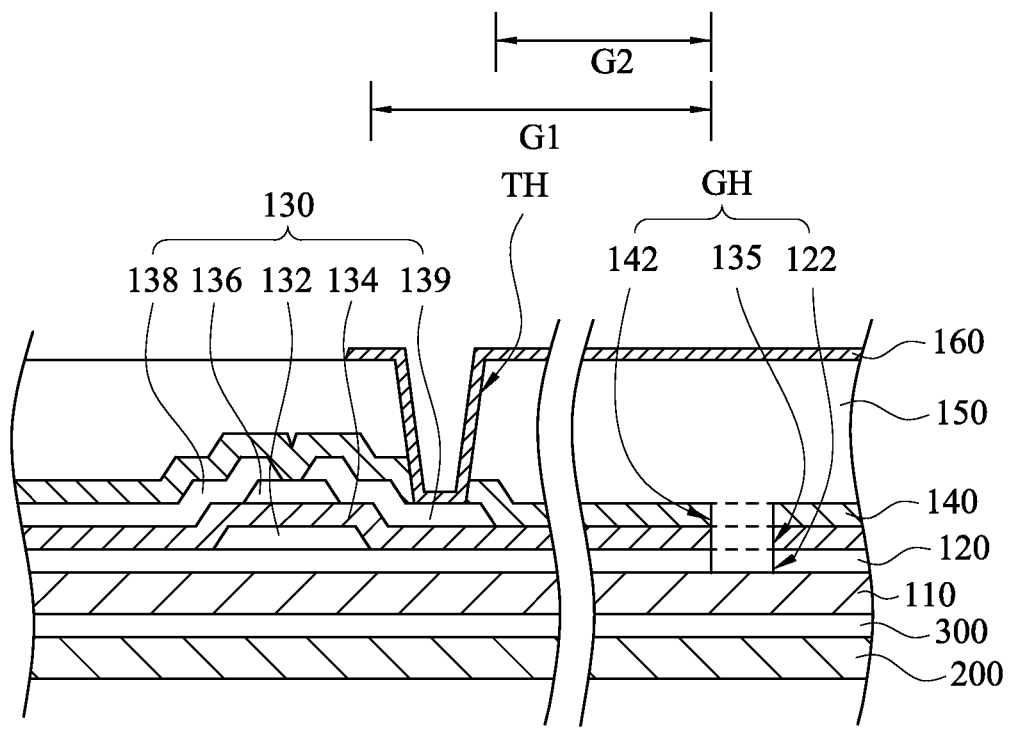

Reference is made to FIG. 5D. The pixel electrode 160 is formed on the active component 130 and is electrically connected to the active component 130. Because the process, the material and the detailed structure related to the pixel electrode 160 are the same as those in the third embodiment, they are not repeated herein.

Figure 5E:
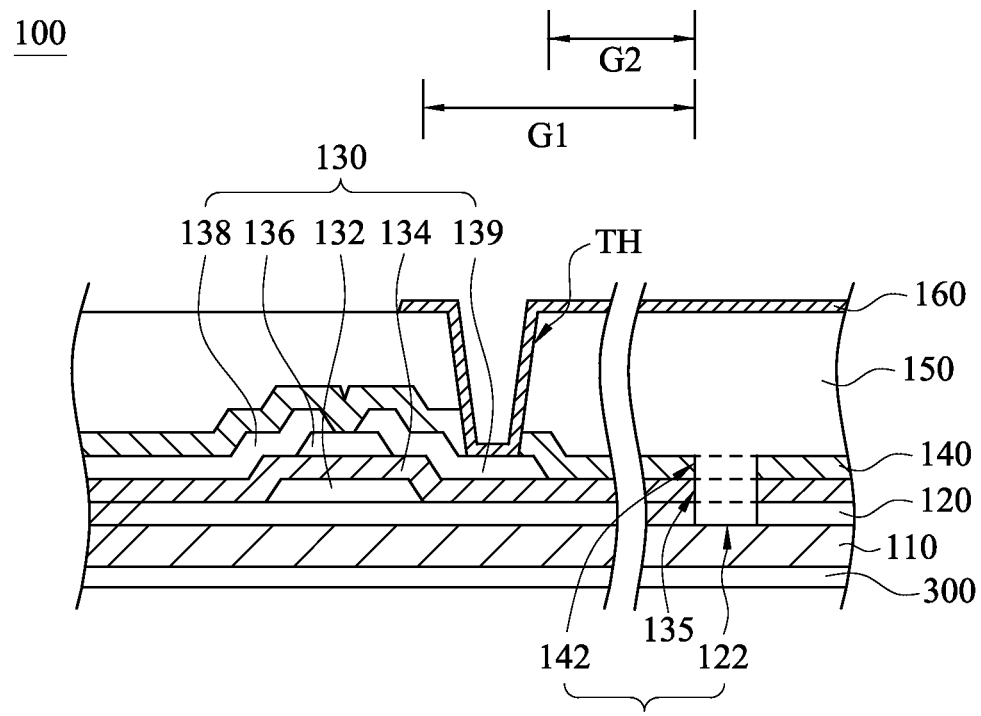

Reference is made to FIG. 5E. The flexible substrate 110 and the photosensitive stripping layer 300 are stripped from the carrier 200 so that the active array substrate 100 is obtained. In the view of structure, the difference between the active array substrate 100 in FIG. 5E and that in the third embodiment is that there is no inorganic filling material 170 in the gas hole GH in FIG. 5E, and at least one portion of the organic protection layer 150 is filled in the gas hole GH. That is, there is no inorganic filling material 170 in the through hole 122 of the inorganic barrier layer 120, the through hole 135 of the gate dielectric layer 134, and the through hole 142 of the inorganic protection layer 140. At least one portion of the organic protection layer 150 is filled in the through hole 122 of the inorganic barrier layer 120, the through hole 135 of the gate dielectric layer 134, and the through hole 142 of the inorganic protection layer 140.

FIGS. 6A-6E are cross-sectional views of a manufacturing method of an active array substrate 100 with the same cross-section as FIG. 5A according to the fifth embodiment of this invention. The difference between this embodiment and the fourth embodiment is that after the organic protection layer 150 and the pixel electrode 160 have been formed, the photosensitive stripping layer 300 is photooxidated.

Figure 6A:
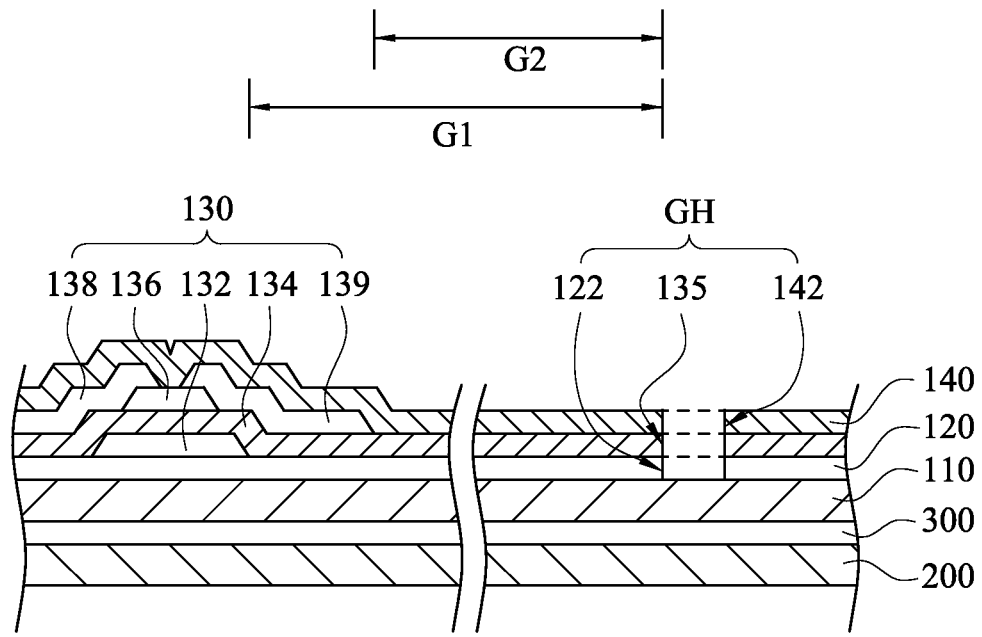
FIGS. 6A-6E are cross-sectional views of a manufacturing method of an active array substrate with the same cross-section as FIG. 5A according to the fifth embodiment of this invention.

Reference is made to FIG. 6A first. The steps as shown in FIG. 5A are performed. Because the process, the material, and the detailed structure are the same as those in the third embodiment, they are not repeated herein.

Figure 6B:
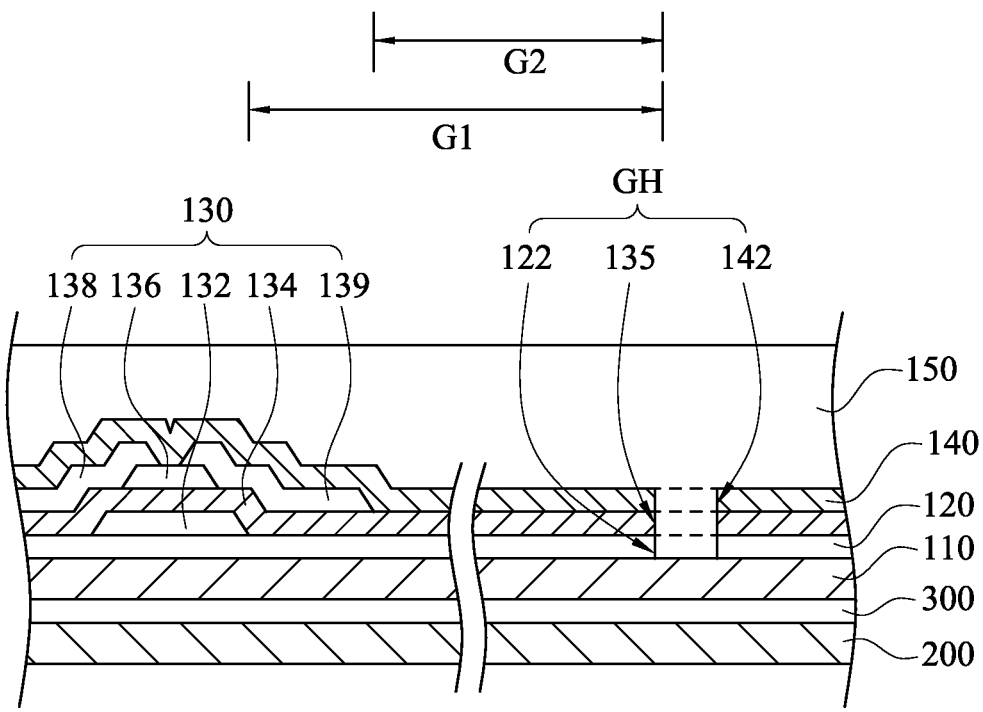

Reference is made to FIG. 6B. The organic protection layer 150 is formed. The organic protection layer 150 covers the inorganic protection layer 140, and at least one portion of the organic protection layer 150 is filled in the gas hole GH. In this embodiment, the organic protection layer 150 may be made of any organic dielectric material which is oxygen permeable, for example, acrylic polymer. Because the process and the detailed structure related to the organic protection layer 150 are the same as those in the fourth embodiment, they are not repeated herein.

Figure 6C:
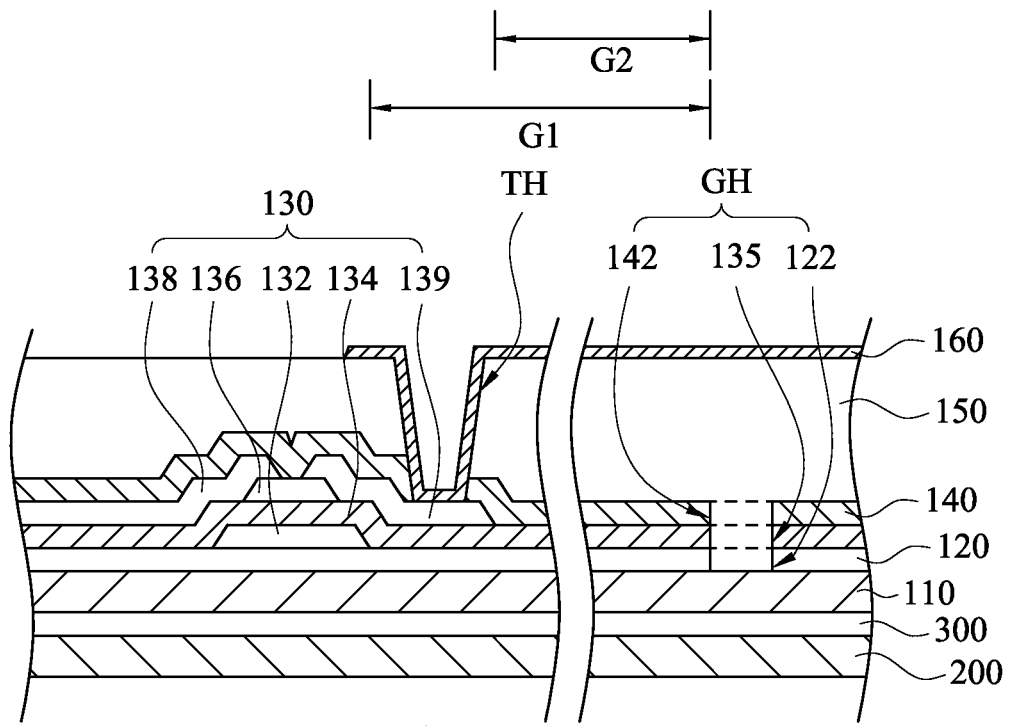

Reference is made to FIG. 6C. The pixel electrode 160 is formed on the active component 130 and is electrically connected to the active component 130. In this embodiment, the pixel electrode 160 may be made of a conductive material which is oxygen permeable, for example, indium tin oxide, indium zinc oxide, aluminum zinc oxide, other conductive oxide or any combination thereof. Because the process, the material and the detailed structure related to the pixel electrode 160 are the same as those in the fourth embodiment, they are not repeated herein.

Figure 6D:
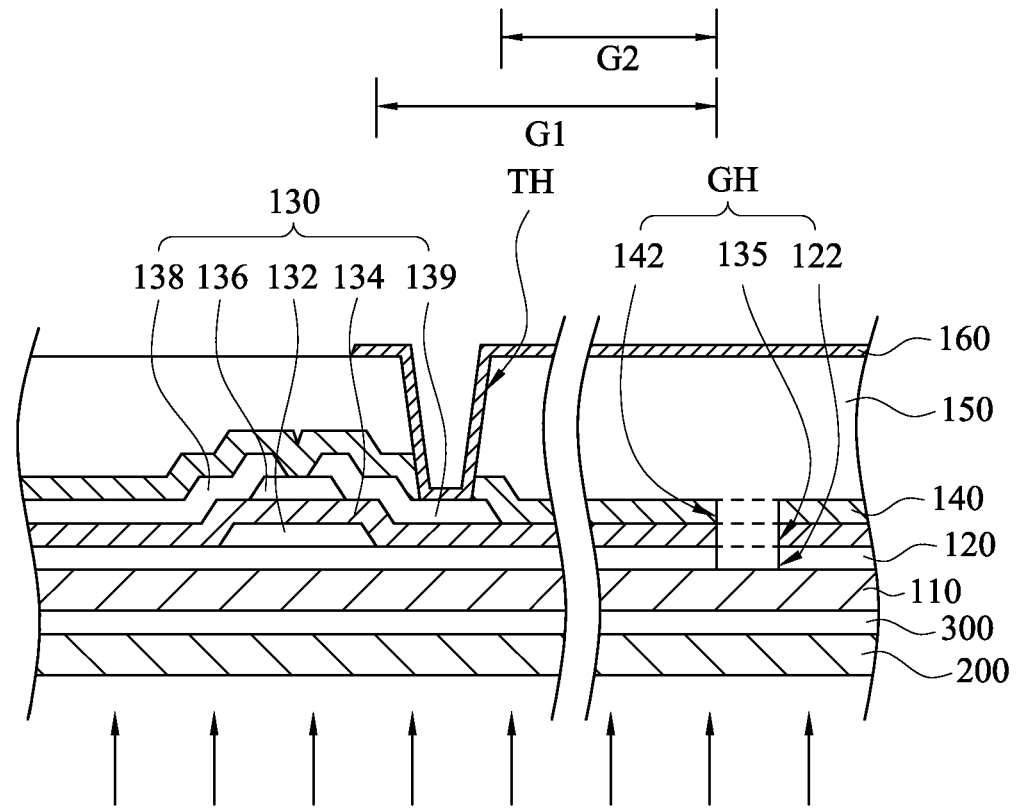

Reference is made to FIG. 6D. The photosensitive stripping layer 300 is irradiated by a light source so that the adhesion between the photosensitive stripping layer 300 and the carrier 200 is reduced after the photosensitive stripping layer 300 is photooxidated. Because the organic protection layer 150 and the pixel electrode 160 is oxygen permeable, the oxygen may penetrate through the organic protection layer 150, the pixel electrode 160, and the flexible substrate 110 to reach the surface of the photosensitive stripping layer 300. Therefore, the photooxidation of the photosensitive stripping layer 300 is faster, and thus the time required to manufacture the active array substrate 100 is reduced.

Figure 6E:
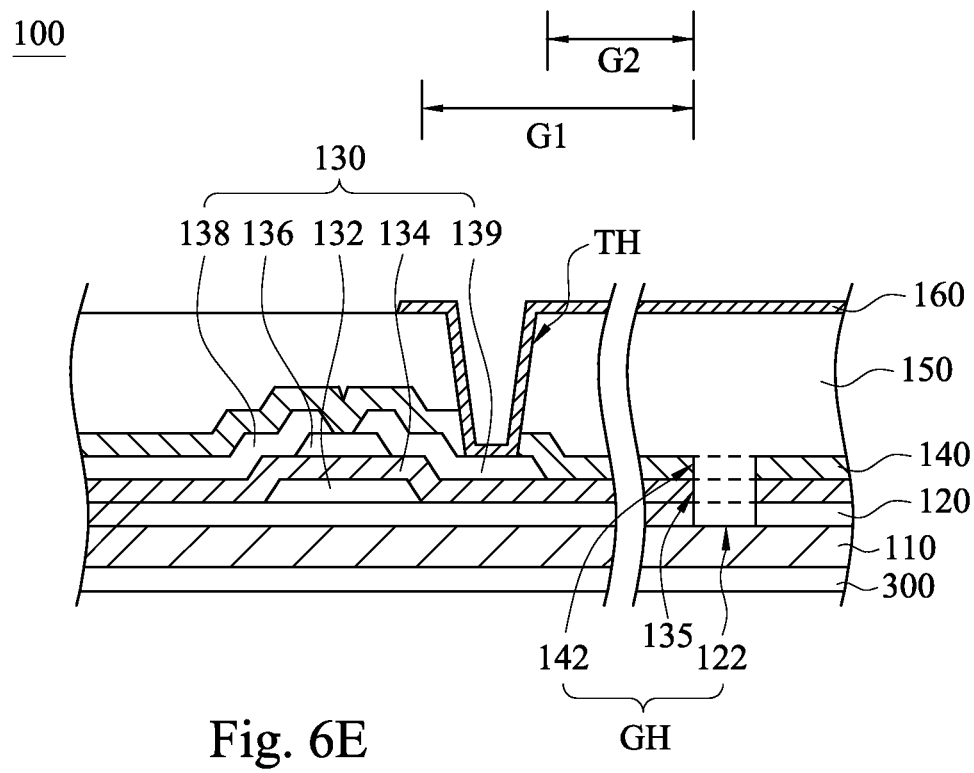

Reference is made to FIG. 6E. The flexible substrate 110 and the photosensitive stripping layer 300 are stripped from the carrier 200 so that the active array substrate 100 is obtained. In the view of structure, the structure of the active array substrate 100 in FIG. 6E and that in FIG. 5E are substantially the same.

FIGS. 7A-7E are cross-sectional views of a manufacturing method of an active array substrate 100 with the same cross-section as FIGS. 2A-2H according to the sixth embodiment of this invention. The difference between this embodiment and the first embodiment is that after the organic protection layer 150 is formed, the pixel electrode through hole TH and the gas hole GH are formed first so that the pixel electrode 160 covers the gas hole GH.

Figure 7A:
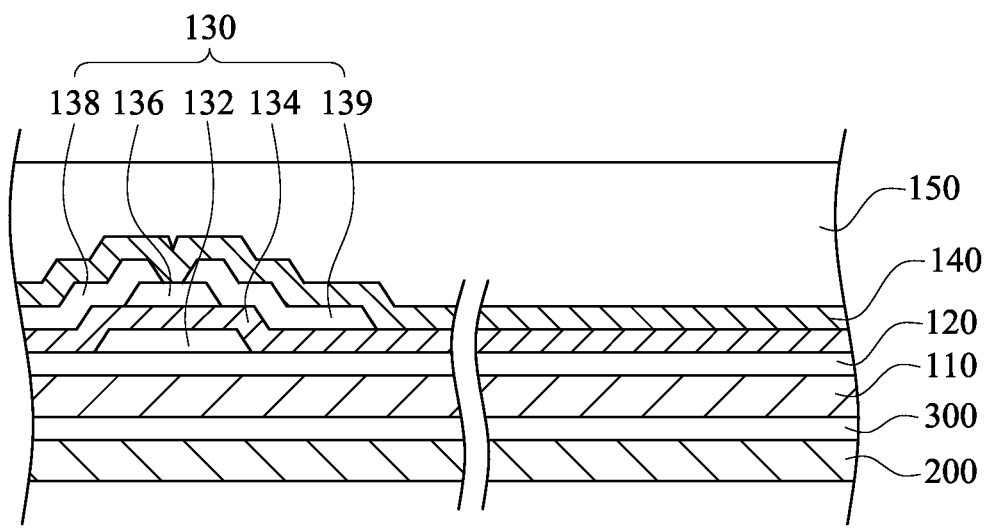
FIGS. 7A-7E are cross-sectional views of a manufacturing method of an active array substrate with the same cross-section as FIGS. 2A-2H according to the sixth embodiment of this invention.

Reference is made to FIG. 7A first. The steps as shown in FIGS. 2A-2H are performed. Because the process, the material, and the detailed structure are the same as those in the first embodiment, they are not repeated herein.

Figure 7B:
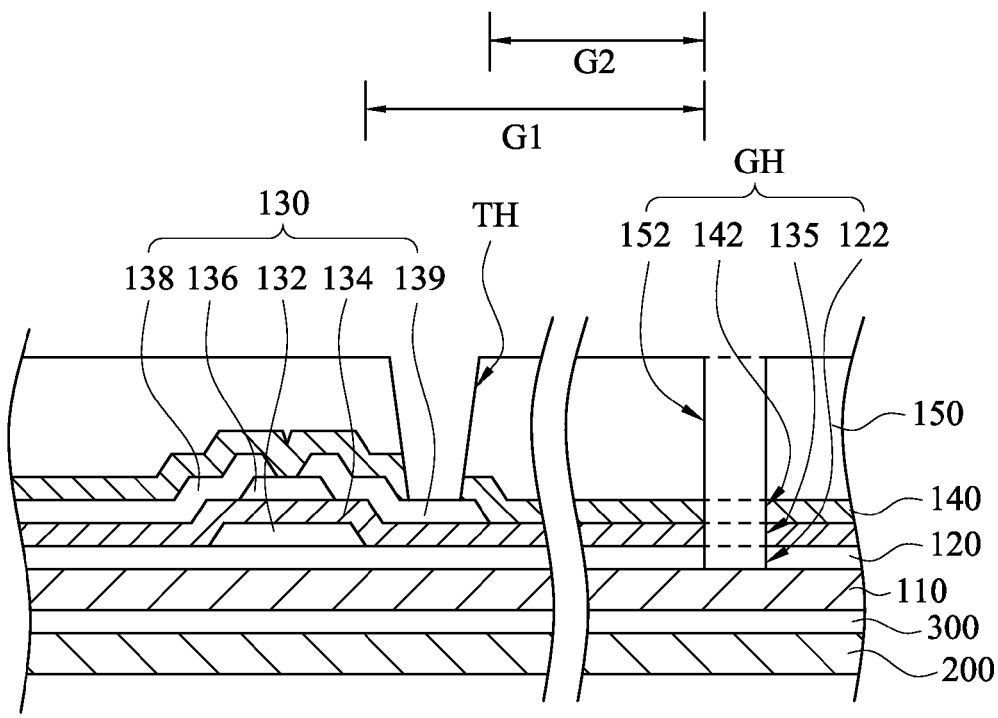

Reference is made to FIG. 7B. The pixel electrode through hole TH and the gas hole GH are formed. The pixel electrode through hole TH penetrates through the inorganic protection layer 140 and the organic protection layer 150 to expose the drain 139. The gas hole GH penetrates through the inorganic barrier layer 120, the gate dielectric layer 134, the inorganic protection layer 140, and the organic protection layer 150 to expose the flexible substrate 110. In this embodiment, the forming method of the pixel electrode through hole TH and the gas hole GH may be, for example, photolithography and etching.

Figure 7C:
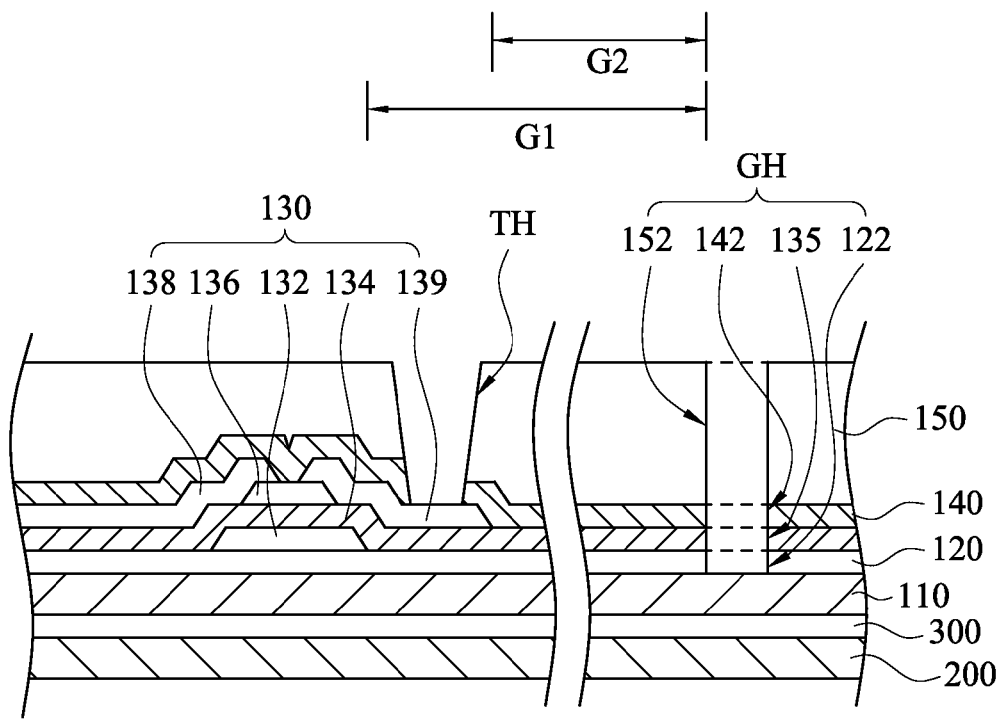

Reference is made to FIG. 7C. The photosensitive stripping layer 300 is irradiated by a light source so that the adhesion between the photosensitive stripping layer 300 and the carrier 200 is reduced after the photosensitive stripping layer 300 has been photooxidated. Similarly, because of the gas hole GH, the oxygen may be in contact with the photosensitive stripping layer 300 not only at the exposed side portions but also on the surface adjacent to the flexible substrate 110 through the gas hole GH and the flexible substrate 110. Therefore, the photooxidation of the photosensitive stripping layer 300 is faster, and thus the time required to manufacture the active array substrate 100 is reduced.

Figure 7D:
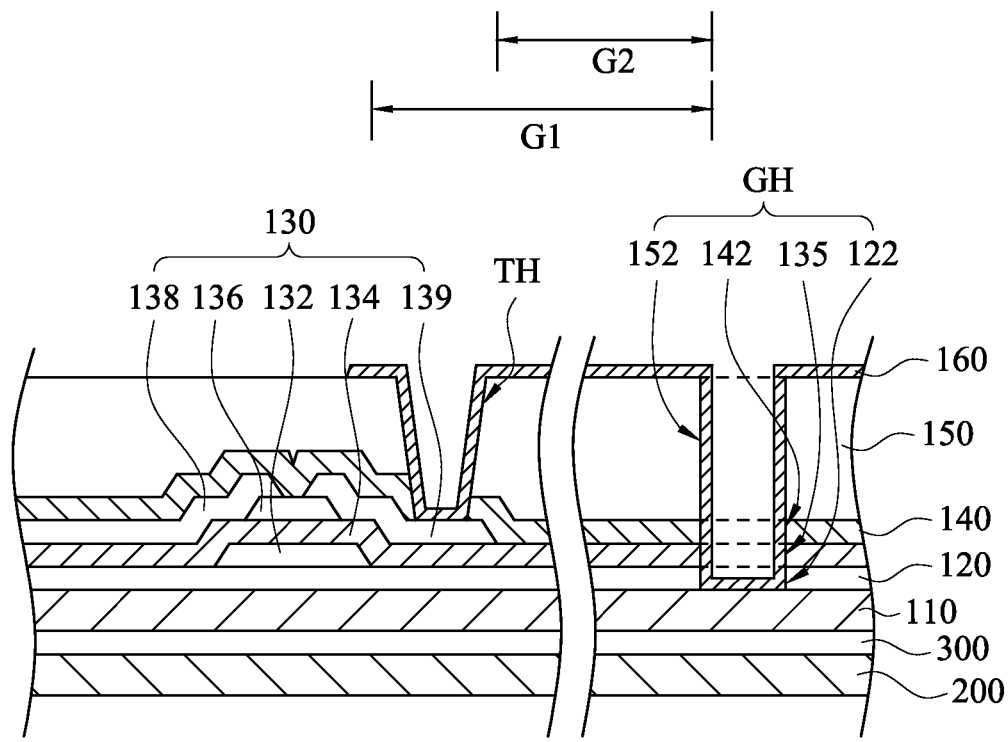

Reference is made to FIG. 7D. The pixel electrode 160 is formed on the active component 130 and is electrically connected to the active component 130. In practice, the third conductive layer is formed to cover the organic protection layer 150, the pixel electrode through hole TH, and the gas hole GH. The third conductive layer is patterned to form the pixel electrode 160. The pixel electrode 160 is electrically connected to the drain 139 through the pixel electrode through hole TH and covers the gas hole GH.

During the formation of the third conductive layer, the photosensitive stripping layer 300 has been photooxidated, so the third conductive layer may be formed by a low-temperature process, for example, plasma-enhanced CVD or low-temperature vacuum sputtering. The third conductive layer (that is, the pixel electrode 160) may be made of a transparent conductive material, for example, indium tin oxide, indium zinc oxide, aluminum zinc oxide, other conductive oxide or any combination thereof. Otherwise, the third conductive layer (that is, the pixel electrode 160) may be made of other nontransparent conductive material, for example, titanium, molybdenum, chromium, iridium, aluminum, copper, silver, gold, or any combination or alloy thereof. The thickness of the third conductive layer (that is, the pixel electrode 160) may be in a range from about 10 nm to about 500 nm. The patterning method of the third conductive layer may be, for example, photolithography and etching.

Figure 7E:
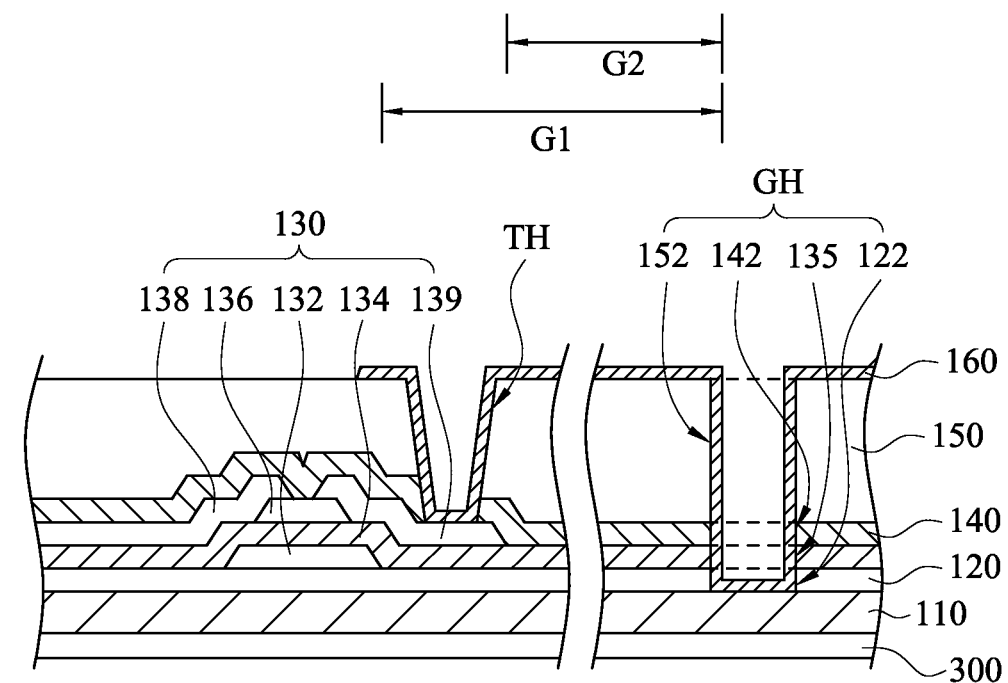

Reference is made to FIG. 7E. The flexible substrate 110 and the photosensitive stripping layer 300 are stripped from the carrier 200 so that the active array substrate 100 is obtained. In the view of structure, the difference between the active array substrate 100 in FIG. 7E and that in the first embodiment is that the pixel electrode 160 covers the gas hole GH. That is, the pixel electrode 160 in this embodiment covers the through hole 152 of the organic protection layer 150, the through hole 142 of the inorganic protection layer 140, the through hole 135 of the gate dielectric layer 134 and the through hole 122 of the inorganic barrier layer 120.

The active array substrate 100 described in the aforementioned embodiments may be utilized in various display devices including but not limited to: liquid crystal displays (LCDs), electro-phoretic displays (EPDs), and active-matrix organic light-emitting diode displays (AMOLEDs). It should be understood that the aforementioned applications of the active array substrate 100 are merely examples and do not tend to limit the claimed scope. The person having ordinary skill in the art may select a proper application of the active array substrate 100 as required.

The following working examples of this invention are disclosed to explain that the gas hole in the aforementioned embodiments can indeed increase the oxidation speed of the photosensitive stripping layer. It should be noted that in the following description, the parameters mentioned in the aforementioned embodiments are not repeated, and only the parameters which need to be further defined are explained as below.

In the following comparative and working examples, the carrier was made of transparent glass, and the size of the carrier was 320 mm*400 mm*0.7 mm. The photosensitive stripping layer was formed on the carrier. The photosensitive stripping layer was made of poly(p-xylylene), that is, parylene, and the thickness of the photosensitive stripping layer was 300 nm. The flexible substrate was formed on the photosensitive stripping layer. The flexible substrate was made of polyimide, and the thickness of the flexible substrate was 10 µm. The inorganic barrier layer was formed on the flexible substrate. The inorganic barrier layer was made of silicon nitride, and the thickness of the inorganic barrier layer was 200 nm. The difference between the comparative and working examples was that there was no gas hole in the comparative example, while the gas holes were formed to penetrate through the inorganic barrier layer and to expose the flexible substrate in the working example. These gas holes were distributed uniformly in the inorganic barrier layer. The diameter of the gas holes was 5 µm, and the space between two adjacent gas holes was 250 µm.

Figure 8:
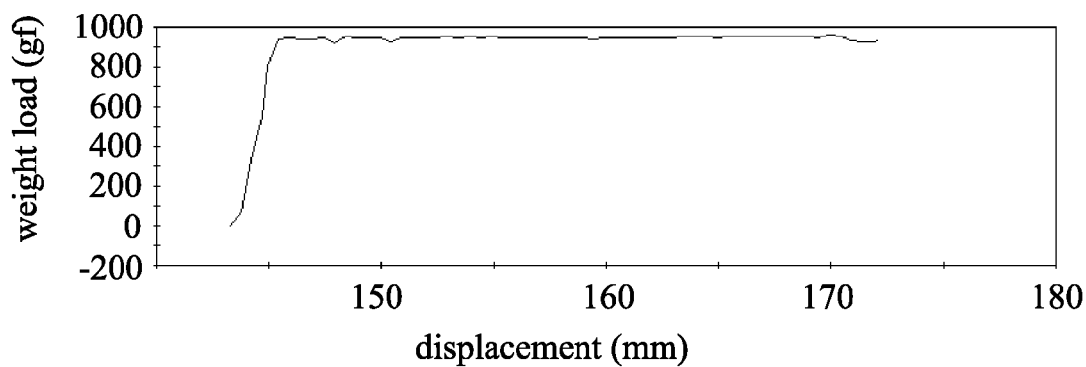
FIG. 8 is a curve of the weight load and the displacement according to the comparative example of this invention.
Figure 9:
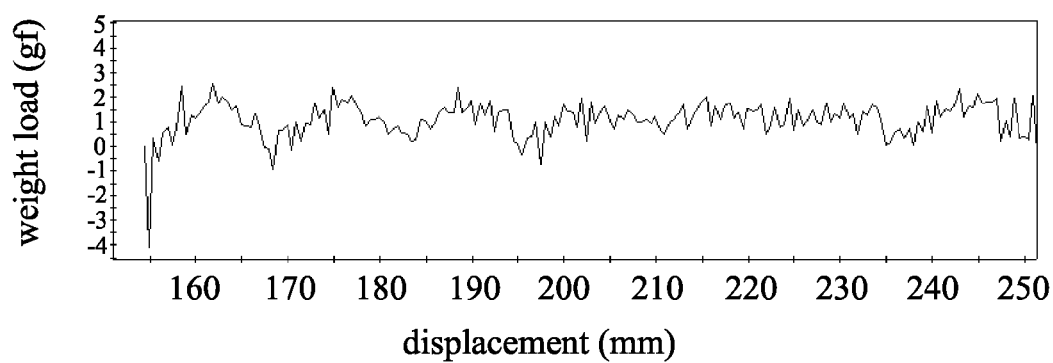
FIG. 9 is a curve of the weight load and the displacement according to the working example of this invention.

Then, ultraviolet light was irradiated to the back side of the carrier opposite to the photosensitive stripping layer for ten minutes. The bonding between the flexible substrate and the carrier was measured to obtain the relation of the weight load and the displacement. The results were recorded in FIGS. 8-9. FIG. 8 is a curve of the weight load and the displacement according to the comparative example of this invention, and FIG. 9 is a curve of the weight load and the displacement according to the working example of this invention. As shown in FIG. 8, after the irradiation of ultraviolet light for ten minutes, the weight load to separate the flexible substrate and the carrier is about 950 gf. Correspondingly, from FIG. 9, after the irradiation of ultraviolet light for ten minutes, the weight load to separate the flexible substrate and the carrier is only 1 gf.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of an active array substrate comprising:
   forming a flexible substrate on a carrier with a photosensitive stripping layer therebetween;
   forming an inorganic barrier layer to cover the flexible substrate;
   forming at least one active component on the inorganic barrier layer;
   forming a through hole in the inorganic barrier layer to expose the flexible substrate;
   irradiating the photosensitive stripping layer with a light source; and
   stripping the photosensitive stripping layer from the carrier.

2. The manufacturing method of claim 1, wherein the step of forming the active component further comprises:
   forming a gate electrode on the inorganic barrier layer;
   forming a gate dielectric layer at least covering the gate electrode;
   forming a channel layer on at least a portion of the gate dielectric layer that is on the gate electrode; and
   forming a source and a drain on opposite sides of the channel layer.

3. The manufacturing method of claim 2, further comprising:
   forming a through hole in the gate dielectric layer, wherein the through hole of the gate dielectric layer is connected to the through hole of the inorganic barrier layer to form a gas hole which exposes the flexible substrate.

4. The manufacturing method of claim 2, further comprising:
   forming a through hole in the gate dielectric layer;
   forming an inorganic protection layer to cover the active component, wherein the inorganic protection layer has at least one through hole therein, and wherein the through hole of the inorganic protection layer is connected to the through hole of the gate dielectric layer and the through hole of inorganic barrier layer to form a gas hole;
   forming an organic protection layer on the inorganic protection layer; and
   forming a pixel electrode on the organic protection layer, wherein the pixel electrode is electrically connected to the active component.

5. The manufacturing method of claim 1, further comprising:
   forming an inorganic protection layer to cover the active component, wherein the inorganic protection layer has at least one through hole therein, and wherein the through hole of the inorganic protection layer is connected to the through hole of the inorganic barrier layer to form a gas hole which exposes the flexible substrate.

6. The manufacturing method of claim 1, further comprising:
   forming an inorganic filling material in the through hole of the inorganic barrier layer.

\* \* \* \* \*